US011928773B2

(12) United States Patent
Davies et al.

(10) Patent No.: US 11,928,773 B2
(45) Date of Patent: *Mar. 12, 2024

(54) SHAPED-BASED TECHNIQUES FOR EXPLORING DESIGN SPACES

(71) Applicant: AUTODESK, INC., San Francisco, CA (US)

(72) Inventors: Thomas Ryan Davies, Toronto (CA); Michael Haley, San Rafael, CA (US); Ara Danielyan, Toronto (CA); Morgan Fabian, Corona Del Mar, CA (US)

(73) Assignee: AUTODESK, INC., San Francisco, CA (US)

( * ) Notice: Subject to any disclaimer, the term of this patent is extended or adjusted under 35 U.S.C. 154(b) by 61 days.

This patent is subject to a terminal disclaimer.

(21) Appl. No.: 17/678,609

(22) Filed: Feb. 23, 2022

(65) Prior Publication Data
US 2022/0180596 A1 Jun. 9, 2022

Related U.S. Application Data

(63) Continuation of application No. 16/174,110, filed on Oct. 29, 2018, now Pat. No. 11,380,045.

(51) Int. Cl.
*G06T 15/20* (2011.01)
*G06F 30/00* (2020.01)
(Continued)

(52) U.S. Cl.
CPC .............. *G06T 15/20* (2013.01); *G06F 30/00* (2020.01); *G06N 3/04* (2013.01); *G06N 3/088* (2013.01)

(58) Field of Classification Search
CPC .................................. G06T 15/20; G06N 3/08
See application file for complete search history.

(56) References Cited

U.S. PATENT DOCUMENTS 7,295,958 B1    11/2007   Suh et al.
7,315,403 B2     1/2008   Konishi
(Continued)

OTHER PUBLICATIONS

Zaman et al., "GEM-NI: A System for Creating and Managing Alternatives In Generative Design", Proceedings of the 49 33rd Annual ACM Conference on Human Factors in Computing Systems (CHI '15), ACM, http://doi.org/10.1145/2702123.2702398, 2015, pp. 1201-1210.

(Continued)

*Primary Examiner* — Yi Yang
(74) *Attorney, Agent, or Firm* — Artegis Law Group, LLP

(57) ABSTRACT

In various embodiments, a training application generates a trained encoder that automatically generates shape embeddings having a first size and representing three-dimensional (3D) geometry shapes. First, the training application generates a different view activation for each of multiple views associated with a first 3D geometry based on a first convolutional neural network (CNN) block. The training application then aggregates the view activations to generate a tiled activation. Subsequently, the training application generates a first shape embedding having the first size based on the tiled activation and a second CNN block. The training application then generates multiple re-constructed views based on the first shape embedding. The training application performs training operation(s) on at least one of the first CNN block and the second CNN block based on the views and the re-constructed views to generate the trained encoder.

25 Claims, 8 Drawing Sheets

(51) Int. Cl.
G06N 3/04 (2023.01)
G06N 3/088 (2023.01)

(56) References Cited

U.S. PATENT DOCUMENTS

| | | | |
|---|---|---|---|
| 8,490,034 | B1 | 7/2013 | Torunoglu et al. |
| 8,606,774 | B1 | 12/2013 | Makadia et al. |
| 8,976,193 | B2 | 3/2015 | Takakura et al. |
| 8,990,672 | B1 | 3/2015 | Grosz et al. |
| 9,530,024 | B2 | 12/2016 | Li et al. |
| 9,600,151 | B2 | 3/2017 | Davis et al. |
| 9,773,023 | B2 | 9/2017 | Iorio |
| 10,296,626 | B2 | 5/2019 | Haley et al. |
| 10,871,884 | B1 | 12/2020 | Cole et al. |
| 2005/0046645 | A1 | 3/2005 | Breton et al. |
| 2005/0063613 | A1 | 3/2005 | Casey et al. |
| 2007/0078634 | A1 | 4/2007 | Krishnapillai |
| 2007/0292046 | A1 | 12/2007 | Johnson |
| 2009/0208097 | A1 | 8/2009 | Husseini et al. |
| 2010/0199227 | A1 | 8/2010 | Xiao et al. |
| 2013/0009957 | A1 | 1/2013 | Arakita |
| 2013/0141570 | A1 | 6/2013 | Saruta et al. |
| 2013/0239055 | A1 | 9/2013 | Ubillos |
| 2013/0305191 | A1 | 11/2013 | Ishizawa |
| 2013/0342533 | A1 | 12/2013 | Bell et al. |
| 2014/0074758 | A1 | 3/2014 | Amid et al. |
| 2014/0139518 | A1 | 5/2014 | Kim et al. |
| 2014/0300758 | A1 | 10/2014 | Tran |
| 2014/0324823 | A1 | 10/2014 | Iorio |
| 2015/0030219 | A1 | 1/2015 | Madabhushi et al. |
| 2015/0186423 | A1 | 7/2015 | Guo et al. |
| 2015/0289162 | A1 | 10/2015 | Frydman et al. |
| 2015/0317452 | A1 | 11/2015 | Kozuka et al. |
| 2017/0046563 | A1 | 2/2017 | Kim et al. |
| 2017/0287230 | A1 | 10/2017 | Gortler et al. |
| 2017/0329804 | A1 | 11/2017 | Fu et al. |
| 2018/0082692 | A1* | 3/2018 | Khoury .......... G10L 17/04 |
| 2018/0143966 | A1 | 5/2018 | Lu et al. |
| 2018/0181802 | A1 | 6/2018 | Chen et al. |
| 2018/0240235 | A1 | 8/2018 | Mazo |
| 2018/0267676 | A1 | 9/2018 | Glueck et al. |
| 2018/0314985 | A1 | 11/2018 | O'Shea |
| 2019/0026550 | A1* | 1/2019 | Yang ............ G06V 30/19147 |
| 2019/0188882 | A1 | 6/2019 | Son et al. |
| 2019/0271632 | A1 | 9/2019 | Yang et al. |
| 2019/0325086 | A1 | 10/2019 | Grossman et al. |
| 2019/0325099 | A1 | 10/2019 | Grossman et al. |

OTHER PUBLICATIONS

Generative Design at Airbus | Customer Stories | Autodesk, https://www.aulodesk.com/customer-slories/airbus, Retrieved on Apr. 5, 2020, 20 pages.
Here's What You Get When You Design a Chair With Algorithms, Wired, from https://www.wired.com/2016/10/elbo-chair-autodesk-algorithm/, Oct. 3, 2016, 8 pages.
Project Dreamcatcher | Autodesk Research. from https://autodeskresearch.com/projects/dreamcatcher, Retrieved Apr. 6, 2020, 43 pages.
Notice of Allowance received for U.S. Appl. No. 16/174,115 dated Apr. 5, 2023, 8 pages.
Non Final Office Action received for U.S. Appl. No. 16/174,115, dated Dec. 20, 2019, 18 pages.
Non Final Office Action received for U.S. Appl. No. 16/174,119, dated Feb. 5, 2020, 21 pages.
Non Final Office Action received for U.S. Appl. No. 16/174,110, dated Oct. 2, 2019, 12 pages.
Final Office Action received for U.S. Appl. No. 16/174,110, dated Feb. 11, 2020, 13 pages.
Final Office Action received for U.S. Appl. No. 16/174,115, dated Apr. 22, 2020, 23 pages.
Final Office Action received for U.S. Appl. No. 16/174,119, dated Jun. 4, 2020, 25 pages.
Non Final Office Action received for U.S. Appl. No. 16/174,110, dated Oct. 19, 2020, 33 pages.
Non Final Office Action received for U.S. Appl. No. 16/174,115, dated Dec. 8, 2020, 21 pages.
Final Office Action received for U.S. Appl. No. 16/174,110, dated Mar. 25, 2021, 19 pages.
Non Final Office Action received for U.S. Appl. No. 16/174,119, dated Jan. 21, 2021, 36 pages.
Final Office Action received for U.S. Appl. No. 16/174,115, dated Apr. 5, 2021, 19 pages.
Notice of Allowance received for U.S. Appl. No. 16/174,119, dated May 20, 2021, 10 pages.
Non Final Office Action received for U.S. Appl. No. 16/174,110, dated Jun. 15, 2021, 18 pages.
Notice of Allowance received for U.S. Appl. No. 16/174,110, dated Oct. 7, 2021, 12 pages.
Notice of Allowability received for U.S. Appl. No. 16/174,119, dated Jul. 26, 2021, 7 pages.
Notice of Allowance received for U.S. Appl. No. 16/174,110, dated Mar. 21, 2022, 15 pages.
Non Final Office Action received for U.S. Appl. No. 16/174,115 dated Dec. 21, 2021, 24 pages.
Final Office Action received for U.S. Appl. No. 16/174,115 dated Apr. 29, 2022, 18 pages.
Non Final Office Action received for U.S. Appl. No. 16/174,115 dated Dec. 1, 2022, 21 pages.
Burnap et al., "Estimating and Exploring the Product Form Design Space Using Deep Generative Models", Proceedings of the ASME 2016 International Design Engineering Technical Conferences and Computers and Information in Engineering Conference, Aug. 21, 2016, 13 pages.
Agostino et al., "Nonlinear Methods for Design-Space Dimensionality Reduction in Shape Optimization", Dec. 21, 2017, LNCS 10710, pp. 121-132.
Bronstein et al., "Scale-invariant heat kernel signatures for non-rigid shape recognition", 2010 IEEE Conference on Computer Vision and Pattern Recognition, 2010, pp. 1704-1711.
Cao et al., "Exploiting depth from single monocular images for object detection and semantic segmentation", Appearing in IEEE Transactions on Image Processing, arXiv:1610.01706, Oct. 2016, 14 pages.
Chang et al., "Shapenet: An information-rich 3d model repository", 2015, arXiv:1512.03012 [cs.GR], https://arxiv.org/abs/1512.03012, 11 pages.
Cimpoi et al., "Describing textures in the wild", arXiv: 1311.3618, https://arxiv.org/abs/1311.3618, Nov. 15, 2013, 13 pages.
Donahue et al., "Decaf: A deep convolutional activation feature for generic visual recognition", arXiv:1310.1531, https://arxiv.org/abs/1310.1531, Oct. 6, 2013, 10 pages.
Dumoulin et al., "A guide to convolution arithmetic for deep learning", Jan. 11, 2018, arXiv: 1603.07285 [stat. ML], https://arxiv.org/abs/1603.07285, 31 pages.
Kazhdan et al., "Rotation invariant spherical harmonic representation of 3d shape descriptors", Eurographics Symposium on Geometry Processing, 2003, 9 pages.
Krizhevsky et al., "Imagenet classification with deep convolutional neural networks", Advances in Neural Information Processing Systems 25 (NIPS 2012), https://papers.nips.cc/paper/4824-imagenet-classification-with-deep-convolutional-neural-networ, 2012, 9 pages.
Osada et al., Shape distributions, ACM Transactions on Graphics, vol. 21, No. 4, Oct. 2002, pp. 807-832.
Qi et al., "Pointnet: Deep learning on point sets for 3d classification and segmentation", Apr. 10, 2017, arXiv:1612.00593 [cs.CV], https://arxiv.org/abs/1612.00593, 19 pages.
Qi et al., "Pointnet++: Deep hierarchical feature learning on point sets in a metric space", 31st Conference on NeuraInformation Processing Systems {NIPS 2017), 10 pages.
Shamai et al., "Geodesic distance descriptors", Proceedings of the IEEE Conference on Computer Vision and Pattern Recognition, 2017, pp. 6410-6418.
Su et al., "Multi-view convolutional neural networks for 3d shape recognition", Proceedings of the IEEE international conference on computer vision, 2015, pp. 945-953.

(56) References Cited

OTHER PUBLICATIONS

Nu et al., "3d shapenets: A deep representation for volumetric shapes", Proceedings of the IEEE conference on computer vision and pattern recognition, 2015, 9 pages.

Zhou et al., "Thingi10k: A dataset of 10,000 3d-printing models", Jul. 2, 2016, arXiv: 1605.04797 [cs.GR], https://arxiv.org/abs/1605.04797, 8 pages.

Alhashim et al., "Topolo g y -varying 3D Shape Creation via Structural Blending", ACM Transactions on Graphics, vol. 33, No. 4, Article 158, Jul. 2014, htlp://doi.org/10.1145/2601097.2601102, 10 pages.

Allaire et al., "Structural optimization using sensitivity analysis and a level-set method", Journal of computationalphysics vol. 194, 1, 2004, pp. 363-393.

Ashour et al., "Optimizing Creatively in Multi-objective Optimization", Proceedings of the Symposium on Simulation for Architecture & Urban Design {SimAUD '15), Society for Computer Simulation International, 2015, http://dl.acm.org/ citation.cfm?id=2873021.2873039, 2015, pp. 128-135.

Attar et al., "Embedded Rationality: A Unified Simulation Framework for Interactive Form Finding", International Journal of Architectural Computing, http:/idoi.org/10.1260/1478-0771.8.4.399, vol. 8, Issue 4, 2010, pp. 399-418.

Averkiou et al., "ShapeSynth: Parameterizing Model Collections for Coupled Shape Exploration and Synthesis", http://doi.org/10.1111/cgf.12310, Computer Graphics Forum, vol. 33, No. 2, 2014, pp. 125-134.

Ben-Yitzhak et al., "Beyond basic faceted search", Proceedings of the international conference on Web search and web data mining—WSDM '08, ACM Press, http://portal.acm.org/citation.cfm?doid=1341531.1341539, 2008, pp. 33-43.

Bradner et al., "Parameters Tell the Design Story: Ideation and Abstraction in Design Optimization", Proceedings of the Symposium on Simulation for Architecture & Urban Design (SimAUD '14), Society for Computer Simulation International, http://dl.acm.org/citation.cfm?id=2664323.2664349, 2014, pp. 26:1-26:8.

Corne et al., "The Pareto Envelope-Based Selection Algorithm for Multiobjective Optimisation", Proceedings of the 5th International Conference on Parallel Problem Solving from Nature (PPSN VI), Springer-Verlag, http://dl.acm.org/citation.cfm?id=645825.669102, 2000, pp. 839-848.

Denning et al., MeshGit: Diffing and Merging Meshes for Polygonal Modeling. ACM Transactions on Graphics, vol. 32, No. 4, Article 35, hllp://doi.org/10.1145/2461912.2461942, Jul. 2013, pp. 35:1-35:10.

Dobos et al., "3D Diff: An Interactive Approach to Mesh Differencing and Conflict Resolution", SIGGRAPH Asia 2012 Technical Briefs (SA '12), ACM, http://doi.org/10.1145/24077 46.2407766, Nov. 28 - Dec. 1, 2012, p. 20:1-20:4.

Doraiswamy et al., "Topology-based Catalogue Exploration Framework for Identifying View-enhanced Tower Designs", http://doi.org/10.1145/2816795.2818134, ACM Transactions on Graphics, vol. 34, No. 6, Article 230, Nov. 2015, pp. 230:1-230:13.

Hearst, M., "UIs for Faceted Navigation: Recent Advances and Remaining Open Problems", International Journal of Machine Learning and Computing, http://ryenwhite.com/hcir2008/doc/HCIR08-Proceedings.pdf, 2008, pp. 337-343.

Jain et al., "Exploring Shape Variations by 3D-Model Decomposition and Part-based Recombination", Comput. Graph. Forum 31, 2pt3: 631-640. http://doi.org/10.1111/j. 1467-8659.2012.03042.x, 2012, vol. 31, No. 2, pp. 531-640.

Kalogerakis et al., "A Probabilistic Model for Component-based Shape Synthesis", ACM Transactions on Graphics, vol. 31, No. 4, Article 55, Jul. 2012, http://doi.org/10.1145/2185520.2185551, pp. 55:1-55:11.

Kim et al., "InterAxis: Steering Scatterplot Axes via Observation-Level Interaction", IEEE Transactions on Visualization and Computer Graphics, http://doi.org/10.1109/TVCG.2015.2467615, vol. 22, No. 1, Jan. 2016, pp. 131-140.

Koren et al., "Personalized Interactive Faceted Search", Proceedings of the 17th International Conference on World Wide Web (WWW'08), ACM, http://doi.org/10.1145/1367497.1367562, Apr. 21-25, 2008, pp. 477-486.

Koyama et al., "Crowd-powered Parameter Analysis for Visual Design Exploration", Proceedings of the 27th Annual ACM Symposium on User Interface Sollware and Technology http://doi.org/10.1145/2642918.2647386, UIST'14, Oct. 5-8, 2014, pp. 65-74.

Lee et al., 2009. "Facetlens: Exposing Trends and Relationships to Support Sensemaking Within Faceted Datasets", Proceedings of the SIGCHI Conference on Human Factors in Computing Systems (CHI '09), ACM, http://doi.org/10.1145/1518701.1518896, Apr. 8, 2009, pp. 1293-1302.

Lienhard et al., "Thumbnail Galleries for Procedural Models", Comput. Graph. Forum 33, 2: 361-370. http://doi.org/10.1111/cgf.12317, vol. 33, No. 2, 2014, pp. 361-370.

Marks et al., "Design Galleries: A General Approach to Setting Parameters for Computer Graphics and Animation", Proceedings of the 24th Annual Conference on Computer Graphics and Interactive Techniques (SIGGRAPH '97), ACM Press/Addison-Wesley Publishing Co., http://doi.org/10.1145/258734.258887, 1997, pp. 389-400.

Matejka et al., Video lens: rapid playback and exploration of large video collections and associated metadata, Proceedings of the 27th annual ACM symposium on User interface software and technology, ACM, UIST'14, Oct. 5-8, 2014, pp. 541-550.

Nagy et al., "Project Discover: An Application of Generative Design for Architectural Space Planning", https://www_autodeskresearch.com/publications/project-discover-application-generative-design-architectural-space-planning, 2017, 8 pages.

Porter et al., "Compositing Digital Images. Proceedings of the 11th Annual Conference on Computer Graphics and Interactive Techniques", (SIGGRAPH '84), ACM, 253-259.http://doi.org/10.1145/800031.808606, vol. 18, No. 3, Jul. 1984, pp. 253-259 pages.

Shea et al., "Towards integrated performance-driven generative design tools",Automation in Construction 14, 2, http://doi.org/10.1016/j.autcon.2004.07.002, 2005, pp. 253-264.

Stuart-Moore et al., "Interface Design for Browsing Faceted Metadata", Proceedings of the 6th ACM/IEEE-CS Joint Conference on Digital Libraries (JCDL '06), ACM, http://doi.org/10.1145/1141753.1141844, Jun. 11-15, 2006, 349 pages.

Teery et al., "Side Views: Persistent, On-demand Previews for Open-ended Tasks", Proceedings of the 15th Annual ACM Symposium on User Interface Software and Technology (UIST '02), ACM, http://doi.org/10.1145/571985.571996, UIST'02, Oct. 27-30, 2002, vol. 4, Issue 2, pp. 71-80.

Turrin et al., Design explorations of performance driven geometry in architectural design using parametric modeling and genetic algorithms. Advanced Engineering Informatics 25, 4:, http://doi.org/10.1016/j.aei.2011.07.009, 2011, pp. 656-675.

Ulu et al., "DMS2015-33: Generative interface structure design for supporting existing objects", Journal of Visual Languages & Computing, vol. 31, Part B: http://doi.org/10.1016/j.jvlc.2015.10.016, 2015, pp. 171-183.

Vandic et al., "Facet Selection Algorithms for Web Product Search", Proceedings of the 22nd ACM International Conference on Conference on Information & Knowledge Management (CIKM '13), ACM, http://doi.org/10.1145/2505515.2505664, CIKM'13, Oct. 27-Nov. 1, 2013, pp. 2327-2332.

Voigt et al., "Weighted Faceted Browsing for Characteristics-based Visualization Selection Through End Users", 45 Proceedings of the 4th ACM SIGCHI Symposium on Engineering Interactive Computing Systems (EICS'12), ACM, http://doi.org/10.1145/2305484.2305509, EICS'12, Jun. 25-26, 2012, pp. 151-156.

Wang et al., "A level set method for structural topology optimization", Computer methods in applied mechanics and engineering vol. 192, No. 1, 2003, 227-246.

Xu et al., "Fil and Diverse: Set Evolution for Inspiring 3D Shape Galleries", ACM Transactions on Graphics, vol. 31, No. 4, Article 57, http://doi.org/10.1145/2185520.2185553, Jul. 2012, pp. 57:1-57:10.

Yumer et al., "Procedural Modeling Using Autoencoder Networks", Proceedings of the 28th Annual ACM Symposium on User Interface

(56) References Cited

OTHER PUBLICATIONS

Software & Technology http://doi.org/10.1145/2807442.2807448, (UIST '15), ACM, Nov. 8-11, 2015, pp. 109-118.

* cited by examiner

SHAPED-BASED TECHNIQUES FOR EXPLORING DESIGN SPACES

CROSS-REFERENCE TO RELATED APPLICATIONS

This application is a continuation of the co-pending U.S. patent application titled, "SHAPED-BASED TECHNIQUES FOR EXPLORING DESIGN SPACES," filed on Oct. 29, 2018, and having Ser. No. 16/174,110. The subject matter of the related application is hereby incorporated herein by reference.

BACKGROUND

Field of the Various Embodiments

Embodiments of the present invention relate generally to computer-aided design software and, more specifically, to shaped-based techniques for exploring design spaces.

Description of the Related Art

Generative design is a computer-aided design (CAD) process that automatically synthesizes designs that satisfy any number and type of high-level goals and constraints. In a typical generative design flow, a user specifies the high-level goals and constraints, and a generative design application then executes a variety of multi-objective optimization algorithms to optimize potential solutions based on the high-level goals and constraints. This generative design process is an evolutionary process that typically generates a vast number (e.g., tens of thousands) of complex geometrical designs that satisfy the high-level goals and constraints. The generative design application presents those designs to the user in the context of a design space. Finally, the user explores the "generative" design space, evaluating different designs included in the generative design space to select a single design for production.

In one approach to exploring generative design spaces, a user manually screens designs in the generative design space via graphical user interfaces (GUIs). One drawback of this approach is that visually identifying and comparing salient aspects of hundreds or thousands of different designs is time-consuming and tedious, if even possible. For example, if a user were to prefer a bicycle frame that appears "more or less symmetric" and "skinniest," the user could have to visually scrutinize thousands of different designs in a generative design space for the bicycle frame to determine which design is both more or less symmetric and skinniest in appearance. Because of time constraints, users oftentimes end up selecting an inferior design and unintentionally overlooking superior designs that better reflect the overall preferences of the users.

In another approach to exploring generative design spaces, CAD tools can be used to automatically compare designs based on objective criteria. For example, to explore a generative design space for a bicycle frame, a CAD tool could be used to search, filter, and rank the designs included in the design space based on any combination of weight, volume, tensile strength, and cost criteria. One drawback using these types of CAD tools is that the CAD tools usually do not allow users to automatically compare designs based on shape.

In some CAD tools, automatically comparing designs based on shape is problematic because the relatively large size of existing computational representations for shapes typically implemented by the CAD tools preclude efficient comparisons. In particular, comparing the computational representations for the potentially tens of thousands of designs in a generative design space would require prohibitive amounts of time and compute resources. In the same or other CAD tools, the existing computational representations for shapes do not capture the complex shapes associated with generative designs sufficiently for the purposes of comparison. Other CAD tools implement computational representations for shapes that have similar computational or accuracy limitations. As a result, users oftentimes resort to manually comparing the designs in a generative design space based on aesthetic preferences.

As the foregoing illustrates, what is needed in the art are more effective techniques for exploring generative design spaces.

SUMMARY

One embodiment of the present invention sets forth a computer-implemented method for generating computational representations for three-dimensional (3D) geometry shapes. The method includes, for each view included in multiple views associated with a first 3D geometry, generating a view activation based on a first convolutional neural network (CNN) block; aggregating the view activations to generate a first tiled activation; generating a first shape embedding having a fixed size based on the first tiled activation and a second CNN block; generating multiple re-constructed views based on the first shape embedding; performing one or more training operations on at least one of the first CNN block and the second CNN block based on the multiple views and the multiple re-constructed views to generate a trained encoder; and generating a second shape embedding having the fixed size based on the trained encoder.

At least one technical advantage of the disclosed techniques relative to prior art solutions is that the trained encoder generates shape embeddings that robustly and efficiently represent the shapes of 3D geometries associated with various designs. Unlike prior art solutions, each shape embedding accurately represents one or more salient visual features of a potentially complex 3D design using a vector having a fixed size that is amenable to efficient comparisons across the relatively large number of designs typically associated with a generative design flow. Accordingly, a CAD tool can compare shape embeddings to allow a user to efficiently and subjectively explore a design space associated with a generative design flow based on aesthetic preferences. As a result, the disclosed techniques reduce the likelihood that a user unintentionally overlooks designs that better reflect the aesthetic preferences of the user when selecting a design for production. These technical advantages provide one or more technological advancements over the prior art.

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive con

DETAILED DESCRIPTION

In the following description, numerous specific details are set forth to provide a more thorough understanding of the various embodiments. However, it will be apparent to one of skilled in the art that the inventive concepts may be practiced without one or more of these specific details.

System Overview

Figure 1:
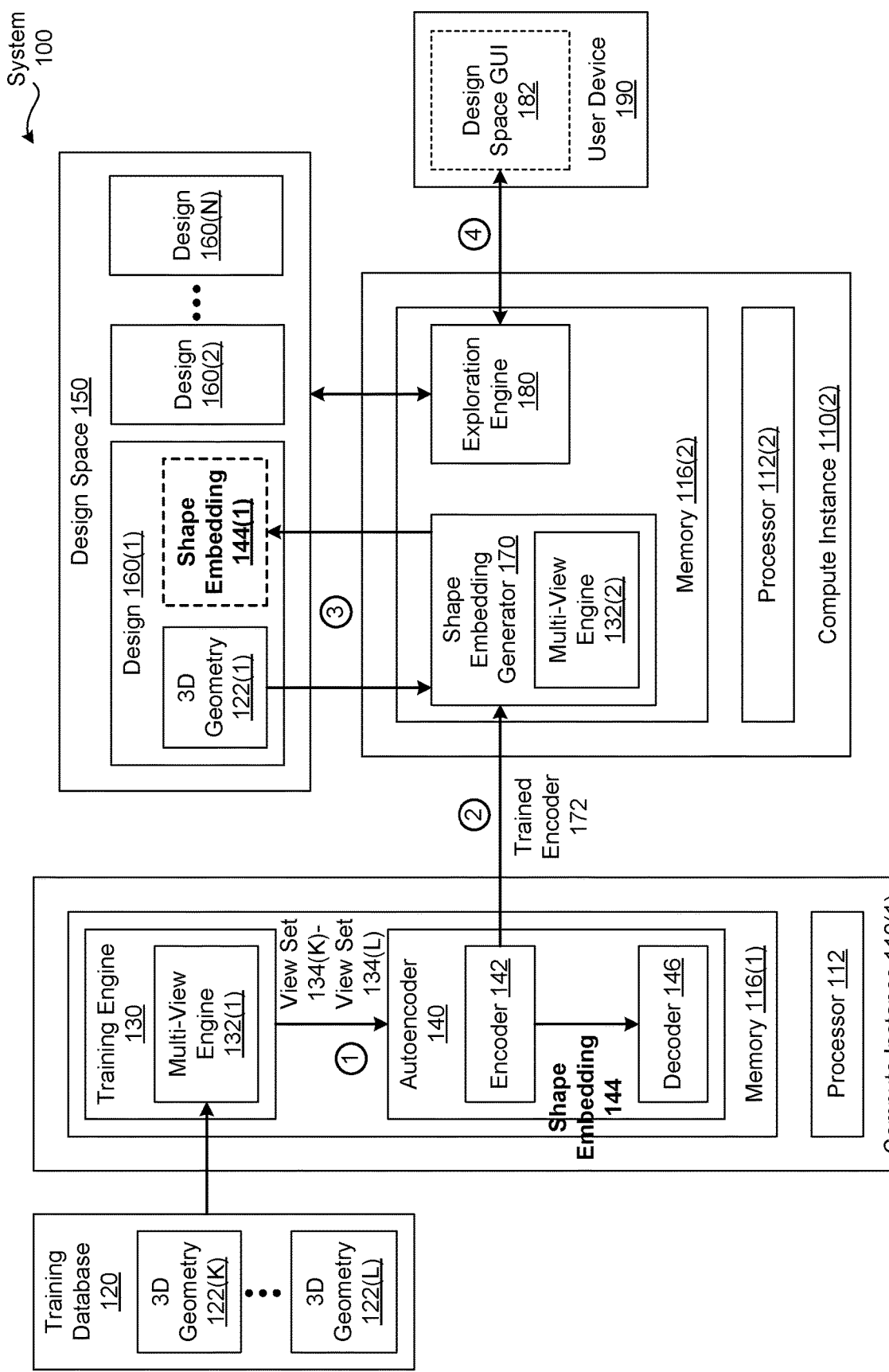
- FIG. 1 is a conceptual illustration of a system configured to implement one or more aspects of the present invention.

FIG. 1 is a conceptual illustration of a system 100 configured to implement one or more aspects of the present invention. As shown, the system 100 includes, without limitation, any number of compute instances 110, a design space 150, a training database 120, and a user device 190. In alternative embodiments, the system 100 may include any number of design spaces 150, training databases 120, and user devices 190 in any combination. In various embodiments, any number of the components of the system 100 may be distributed across multiple geographic locations or implemented in one or more cloud computing environments (i.e., encapsulated shared resources, software, data, etc.) in any combination. For explanatory purposes, multiple instances of like objects are denoted with reference numbers identifying the object and parenthetical numbers identifying the instance where needed.

The user device 190 may be any type of device that is capable of transmitting input data and/or displaying visual content. For example, the user device 190 could be a game console, a smartphone, a smart television (TV), a laptop, a tablet, or a desktop computer. Notably, any number of user devices 190 may also be compute instances 110.

As shown, each of the compute instances 110 includes, without limitation, a processor 112 and a memory 116. The processor 112 may be any instruction execution system, apparatus, or device capable of executing instructions. For example, the processor 112 could comprise a central processing unit (CPU), a graphics processing unit (GPU), a controller, a microcontroller, a state machine, or any combination thereof. The memory 116 stores content, such as software applications and data, for use by the processor 112 of the compute instance 110. In alternative embodiments, each of the compute instances 110 may include any number of processors 112 and any number of memories 116 in any combination. In particular, any number of the compute instances 110 (including one) may provide any number of multiprocessing environments in any technically feasible fashion.

The memory 116 may be one or more of a readily available memory, such as random access memory (RAM), read only memory (ROM), floppy disk, hard disk, or any other form of digital storage, local or remote. In some embodiments, a storage (not shown) may supplement or replace the memory 116. The storage may include any number and type of external memories that are accessible to the processor 112. For example, and without limitation, the storage may include a Secure Digital Card, an external Flash memory, a portable compact disc read-only memory (CD-ROM), an optical storage device, a magnetic storage device, or any suitable combination of the foregoing.

The compute instance 110 is configured to implement one or more applications or subsystems of applications. For explanatory purposes only, each application is depicted as residing in the memory 116 of a single compute instance 110 and executing on a processor 112 of the single compute instance 110. However, as persons skilled in the art will recognize, the functionality of each application may be distributed across any number of other applications that reside in the memories 116 of any number of compute instances 110 and execute on the processors 112 of any number of compute instances 110 in any combination. Further, the functionality of any number of applications or subsystems may be consolidated into a single application or subsystem.

In particular, the compute instances 110 are configured to facilitate exploration of the design space 150. As shown, the design space 150 includes, without limitation, any number of designs 160. Each of the designs 160 included in the design space 150 is associated with a different 3D geometry 122 representing a different outcome of a generative design flow for a 3D object. For example, for a generative design flow for a one-person seat, the design 160(1) could be associated with the 3D geometry 122(2) for a stool, whereas the design 160(2) could be associated with the 3D geometry 122(2) for an armchair. The shape of the 3D geometry 122 is also referred to herein as the "3D geometry shape."

The 3D geometry 122 may be specified in any technically feasible fashion. For instance, the 3D geometry 122 may be specified as a 3D mesh, a polygon soup, volumetric voxels, or an image. In alternative embodiments, the design space 150 may include any number of designs 160, and each of the designs 160 may not necessarily be associated with a generative design flow. For explanatory purposes only, if a design space, including the design space 150, is associated with a generative design flow, then the design space is also referred to herein as a "generative design space."

In a typical generative design flow, a user specifies the high-level goals and constraints, and a generative design application then executes a variety of multi-objective optimization algorithms to optimize potential solutions based on the high-level goals and constraints. This generative design process is an evolutionary process that typically generates a vast number tens of thousands) of complex geometrical designs that satisfy the high-level goals and constraints. The generative design application presents those designs to the user in the context of the design space 150. Notably, each of the outcomes included in the design space 150 may be one of the final outcomes of the generative design flow or one of any number of intermediate outcomes that the generative design application discards as part of the generative design flow.

In general, each of the designs 160 may be associated with any amount and type of metadata at any level of granularity and in any technically feasible fashion. For instance, the metadata may include properties of any number of the designs 160, properties of the design space 150, and properties of a generative design flow used to generate the design space 160, in any combination. Some examples of metadata at the design level of granularity include, without limitation, a width, a height, a mass, a manufacturing cost, a manufacturing status, and a minimum factor of safety. An example of metadata at the final outcome level of granularity is a timeline that specifies intermediate outcomes that were discarded during the generative design flow ordered by iteration. Metadata at the design space level of granularity may include, without limitation, any number and combination of the high-level goals and constraints specified for an associated generative design flow. Any application included in the system 100 may acquire, compute, and/or store any amount and type of metadata in any technically feasible fashion. For instance, a timeline tool (not shown) could receive timeline metadata from a generative design application.

As persons skilled in the art will recognize, conventional techniques for exploring design spaces can be time-consuming and error-prone. For instance, in some conventional systems, a user manually screens designs in a generative design space via graphical user interfaces (GUIs) in an attempt to select a single design that optimizes aesthetic preferences of the user. One drawback of this approach is that visually identifying and comparing salient aspects of hundreds or thousands of different designs is time-consuming and tedious, if even possible. Because of time constraints, users oftentimes end up selecting an inferior design and unintentionally overlooking superior designs that better reflect the overall preferences of the users.

Some conventional computer-aided design (CAD) tools can be used to automatically compare designs based on objective criteria. For example, a CAD tool could be used to search, filter, and rank the designs included in a design space based on any combination of weight, volume, tensile strength, and cost criteria. One drawback using these types of CAD tools is that the CAD tools usually do not allow users to automatically compare designs based on shape. As a general matter, automatically comparing designs based on shape is problematic because the computational representations for shapes typically implemented by CAD tools preclude efficient and/or accurate comparisons. As a result, users oftentimes resort to manually comparing the designs in a generative design space based on aesthetic preferences.

Evaluating Shapes of Designs Based on Machine Learning

To enable users to effectively explore the design space 150 based on aesthetic criteria in a scalable fashion, the system 100 implements machine learning techniques. The system 100 includes, without limitation, a training engine 130, an autoencoder 140, a shape embedding generator 170, and an exploration engine 180. As shown, the training engine 120 and the autoencoder 140 execute on the processor 112(1) of the compute instance 110(1) and are stored in the memory 116(1) of the computer instance 110(1). By contrast, the shape embedding generator 170 and the exploration engine 180 execute on the processor 112(2) of the compute instance 110(2) and are stored in the memory 116(2) of the computer instance 110(2). In alternative embodiments, the system 100 may include any number of training engines 130, autoencoders 150, shape embedding generators 170, and exploration engines 180, in any combination.

In an initial training phase, the training engine 130 implements any number and type of machine learning techniques to train the autoencoder 140 in an unsupervised fashion based on the training database 120. The training database 120 includes, without limitation, any number and type of 3D geometries 122 in any number of formats. The 3D geometries 122 included in the training database 120 may be generated in any technically feasible fashion, and the generation technique may vary between the 3D geometries 122. Further, the 3D geometries 122 included in the training database 120 may be associated with any number and type of design spaces and 3D objects. For example, the 3D geometry 122(1) could be a manually generated design for a coffee table, whereas the 3D geometries 122(2)-122(33, 005) could be different designs for a seat included in a generative design space. In general, to reduce the likelihood of overfitting, the training database 120 includes a wide variety of diverse 3D geometries 122.

The training engine 130 includes, without limitation, an instance of a multi-view engine 132(1). In general, for a given 3D geometry 122, the multi-view engine 132 generates a view set 134 that describes the visual appearance of the 3D geometry 122 in a relatively simple format irrespective of the complexity of the 3D geometry 122. Each view set 134 may include any number of views (not shown in FIG. 1) associated with any number of view types. Examples of view types include, without limitation, depth renderings, phong (RGB) renderings, and phong renderings with depth added. Depth renderings are also referred to herein as "depth views." The multi-view engine 132 may generate the view sets 134 in any technically feasible fashion.

For instance, in some embodiments, the multi-view engine 132 uniformly scales the 3D geometry 122 to fit in a fixed volume. The multi-view engine 132 then places twenty virtual cameras at the vertices of an icosahedron enclosing the scaled 3D geometry 122, where each virtual camera points towards the centroid of the scaled 3D geometry 122. For each virtual camera, the multi-view engine 132 performs rendering operations using a perspective projection to generate a 16-bit grayscale depth rendering. Each of the 16-bit grayscale depth renderings is a different depth view included in a set of twenty depth views associated with the 3D geometry 122.

In operation, the training engine 130 configures the multi-view engine 132(1) to generate a different view set 134 for each of the 3D geometries 122 included in the training database 120. Subsequently, the training engine 130 iteratively performs machine learning operations on the autoencoder 140 based on the different sets of views. Advantageously, performing machine learning operations based on the view set 134 associated with a given 3D geometry 122 instead of directly on the 3D geometry 122 itself decouples the machine learning operations from the internal representation of the 3D geometry 122, such as internal mesh segments.

The autoencoder 140 is a multi-view variational autoencoder that includes, without limitation, an encoder 142 and a decoder 146. During the training phase, the encoder 142 learns the latent distribution of shapes for the 3D geometries 122 included in the training database 120. In general, for a given view set 134, the encoder 140 generates a shape embedding 144. The goal of the training process is to train the encoder 140 to map a view set 134 associated with a 3D geometry 122 to a shape embedding 144 that accurately and efficiently represents the visual style and structure of the 3D geometry 122.

Notably, each of the shape embeddings 144 is a vector that has a fixed size irrespective of the complexity and format of the associated 3D geometry 122. The fixed size may be determined in any technically feasible fashion. For instance, in some embodiments, the fixed size may be determined empirically based on a combination of accuracy and performance criteria. An example of performance criterion is a maximum amount of compute resources required to perform comparisons between tens of thousands of shape embeddings 144. In the same or other embodiments, the fixed size may be acquired via a graphical user interface (GUI) associated with the training engine 130.

In a complementary fashion, during the training phase, the decoder 146 receives the shape embeddings 144 generated by the encoder 142 and learns to re-construct the associated view sets 134 based on the shape embeddings 144. More precisely, for a given shape embedding 144(x), the decoder 146 generates a re-constructed view set (not shown in FIG. 1). For each "original" view included in the view set 134(x), the re-constructed view set includes, without limitation, a corresponding re-constructed view. The training engine 130 implements a loss function that penalizes deviations between a re-constructed view and the original view. The training engine 130 computes a loss based on the loss function, the view sets 134, and the re-construction view sets. Subsequently, the training engine 130 determines whether the encoder 142 and the decoder 146 are trained based on the loss and a completion criteria.

If the training engine 130 determines that the loss does not satisfy the completion criteria, then the training engine 130 modifies machine learning parameters (e.g., weights and biases) associated with the encoder 142 and/or the decoder 146 based on the deviations. The training engine 130 then performs additional iterations of training operations on the autoencoder 140. If, however, the training engine 130 determines that the loss satisfies the completion criteria, then the training engine 130 saves the encoder 142, including the current machine learning parameters, as the trained encoder 172. The decoder 146 is associated only with the training phase and, consequently, the training engine 130 does not save the decoder 146.

The training engine 130 may implement any number and type of loss functions and completion criteria in any technically feasible fashion. For instance, in some embodiments, the training engine 130 may implement a spatial softmax loss function that penalizes deviations between a re-constructed view and the original view at a pixel level of granularity. In the same or other embodiments, the completion criteria may be an acceptable loss threshold that the training engine 130 acquires via a GUI associated with the training engine 130. In alternative embodiments, the autoencoder 140 and/or the training engine 130 may perform any number and type of machine learning training operations in any technically feasible fashion to train the encoder 142 and/or the decoder 146 based on differences between the re-constructed views and the original views. For instance, in some embodiments, the autoencoder 140 includes, without limitation, a loss layer.

As shown, the shape embedding generator 170 includes, without limitation, an instance of the multi-view engine 132(2). For each design 160 included in the design space 150, the multi-view engine 132(2) generates a different view set 134. Subsequently, for each design 160(x) included in the design space 150, the shape embedding generator 170 generates the shape embedding 144(x) based on the associated view set 134 and the trained encoder 172. The shape embedding generator 170 then stores the shape embedding 144(x) as part of the metadata associated with the design 160(x). Accordingly, the shape embedding 144(x) is "aesthetic metadata" associated with the design 160(x).

In alternative embodiments, any application may generate the shape embedding 144(x) in an as-needed fashion instead of pre-generating and storing the shape embeddings 144(x). For instance, in some embodiments, the shape embedding generator 170 computes the shape embeddings 144 for the final outcomes, but not the intermediate outcomes of a generative design flow. In such embodiments, the exploration engine 180 may subsequently compute the shape embeddings 144 for any number of the intermediate outcomes.

Advantageously, the fixed size of the shape embeddings 144 enables efficient comparisons between the shapes of the designs 160 included in the design space 150. In particular, a distance between each shape embedding 144 on the shape embedding manifold indicates a degree of similarity between the designs 160 in an aesthetic space. More precisely, if a distance between the shape embedding 144(x) and the shape embedding 144(y) is relatively small, then the shape of the design 160(x) is relatively similar to the shape of the design 160(y). By contrast, if a distance between the shape embedding 144(x) and the shape embedding 144(y) is relatively large, then the shape of the design 160(x) is relatively dissimilar to the shape of the design 160(y).

The exploration engine 180 enables exploration of the design space 150 via a design space graphical user interface (GUI) 182. In operation, the exploration engine 180 receives commands from users via the design space GUI 182, performs any number and type of operations to execute the commands, and visually displays the results of the commands via the design space GUI 182. In particular, the exploration engine 180 automatically performs any number and type of data analysis operations on the shape embeddings 144 to facilitate aesthetic-based exploration of the design space 150. Some examples of data analysis operations include, without limitation, comparison operations, ranking operations, clustering operations, filtering operations, and searching operations.

As part of executing "proximity-based" shape commands, the exploration engine 180 compares the shapes of two different designs 160(x) and 160(y) based on a distance between the embeddings 144(x) and 144(y). The exploration engine 180 may compute the distance in any technically feasible fashion. For instance, in some embodiments, the exploration engine 180 computes the cosine distance between the embeddings 144(x) and 144(y). In general, the exploration engine 180 may implement any number of proximity-based shape commands in any technically feasible fashion More specifically, to execute a shape proximity summary command associated with a selected design 160(x), the exploration engine 180 computes the pairwise distance between the shape embedding 144(x) and each of the other shape embeddings 144 included in the design space 150. The exploration engine 180 then determines a "similar list" of the "similar" design(s) 160 that are associated with the smallest distances. The exploration engine 180 also determines a "dissimilar list" of the "dissimilar" design(s) 160 that are associated with the largest distances. Subsequently, the exploration engine 180 configures the design space GUI 182 to display and annotate thumbnails of the similar design(s) 160 included in the similar list as "related design(s)" and thumbnails of the dissimilar design(s) 160 included in the dissimilar list as "alternate design(s)."

In response to a shape rank command associated with a selected design 160(x), the exploration engine 180 computes the pairwise distance between the shape embedding 144(x) and each of the other shape embeddings 144 included in the design space 150. The exploration engine 180 then generates a ranked list of the designs 160 based on the distances and an ordering criteria of increasing distance. Accordingly, the ranked list specifies the designs 160 in an order of decreasing visual similarity to the selected design 160(x). Subsequently, the exploration engine 180 configures the design space GUI 182 to display an ordered sequence of thumbnails that represents the ranked list of the designs 160. An example of the design space GUI 182 during a shape rank command is described in conjunction with FIG. 5.

A "smart collapse" command causes the exploration engine 180 to implement a smart collapse mode. In the smart collapse mode, the exploration engine 180 hides repetitive information from the user by combining designs 160 having relatively similar shapes into a single collapsed group. More precisely, the exploration engine 180 computes the pairwise distances between the shape embeddings 144 included in the design space 150. If a distance between any two embeddings 144(x) and 144(y) is smaller than a similarity threshold, then the exploration engine 144 assigns the associated designs 160(x) and 160(y) to a single collapsed group.

The exploration engine 180 may determine the similarity threshold in any technically feasible fashion. For instance, in some embodiments, the exploration engine 180 computes a histogram based on the pairwise distances and then determines the similarity threshold based on the histogram. In the same or other embodiments, the exploration engine 180 determines the similarity threshold, at least in part, based on user input received via the design space GUI 182.

After generating the collapsed groups, the exploration engine 180 configures the design space GUI 182 to display thumbnails representing the collapsed groups instead of thumbnails representing the designs 160. The exploration engine 180 also implements a "smart expand" command that expands the thumbnail representing a selected collapsed group into design-specific thumbnails, where each design-specific thumbnail represents a different design 160 included in the collapsed group. Advantageously, the collapsed groups reduce visual information overwhelm, thereby allowing the user to more effective compare shapes across the design space 150. In some embodiments, to facilitate subsequent operations involving the collapsed groups, the exploration engine 180 may save the collapsed groups via metadata associated with the design space 150.

In various embodiments, a "shape cluster" command causes the exploration engine 180 to perform clustering operations based on the shape embeddings 144. The exploration engine 180 may perform clustering operations across the entire design space 150 or across selected designs 160 within the design space 150. More precisely, the exploration engine 180 performs unsupervised cluster analysis to partition any number of the designs 160 into different shape clusters (not shown). Notably, the exploration engine 180 ensures that the designs 160 included in any given shape cluster are more visual similar to each other than to the designs 160 included in any other shape cluster.

The exploration engine 180 may implement any number and type of clustering techniques to generate shape clusters of visually similar designs 160. For instance, the exploration engine 180 may implement any number and type of centroid-based clustering technique, distribution-based clustering technique, and density-based clustering techniques, to name a few. In some embodiments, to facilitate subsequent operations involving the shape clusters, the exploration engine 180 may save the shape clusters via metadata associated with the design space 150.

After generating new shape clusters, the exploration engine 180 configures the design space GUI 182 to display thumbnails representing the new shape clusters instead of thumbnails representing the designs 160 within the new shape clusters. The exploration engine 180 also implements a "cluster expand" command that expands the thumbnail representing a selected shape cluster into design-specific thumbnails, where each design-specific thumbnail represents a different design 160 included in the shape cluster.

In various embodiments, the exploration engine 180 expands the scope of any number of commands to include collapsed groups and/or shape clusters. For instance, in some embodiments the exploration engine 180 evaluates collapsed groups, shape clusters, and designs 160 when executing a shape proximity summary command or a shape rank command. Consequently, the results of the command may include any number and combination of collapsed groups, shape clusters, and designs 160. And, in a complementary fashion, the exploration engine 180 may display the results of the command as thumbnails representing any number and combination of collapsed groups, clusters, and designs 160.

In the same or other embodiments, the exploration engine 180 expands the scope of the shape cluster command to enable re-clustering of multiple selected shape clusters. In response to a shape cluster command associated with multiple selected shape clusters, the exploration engine 180 selects the designs 160 included in the selected shape clusters. The exploration engine 180 then performs re-clustering operations on the selected designs 160 to generated new shape clusters. The exploration engine 180 replaces the selected shape clusters with the new shape clusters and updates the design space GUI 182 accordingly. In some embodiments, the exploration engine 180 enables the user to limit the number of shape clusters generated during clustering to facilitate a hierarchical and aesthetic exploration of the design space 150 via repeated shape cluster commands.

In general, the shape embeddings 144 enable the exploration engine 180 to provide any number and type of mechanisms that filter and/or search the designs 160 included in design space 150 based on aesthetic criteria at any level of granularity. For instance, in some embodiments, the exploration engine 180 enables users to filter and/or search selected designs 160, selected collapsed groups, and/or selected shape clusters based on shape to generate a results list.

In various embodiments, the exploration engine 180 automatically analyzes the design space 160 based on the shape embeddings 144 in conjunction with other aspects (e.g., properties) of the designs 150, the design space 150, and/or the design flow associated with the design space 150. The exploration engine 180 may perform any number and type of data analysis operations based on the shape embeddings 144 and any amount and type of non-anesthetic metadata. For example, the exploration engine 160 could generate a scatter plot in which each point "x" had a vertical position that reflected the associated manufacturing cost of the design 160(*x*) and a horizontal position that reflected the shape embedding 144(*x*). Further, in various embodiments, the exploration engine 180 enables users to perform any number of data analysis operations on shape clusters or collapsed groups based on non-aesthetic metadata.

In some embodiments, the exploration engine 160 automatically generates plots based on the shape embeddings 144 in addition to non-aesthetic metadata. For example, the exploration engine 160 could generate a scatter plot in which each point "x" had a vertical position that reflected the associated manufacturing cost of the design 160(*x*) and a horizontal position that reflected the shape embedding 144 (*x*). In the same or other embodiments, the exploration engine 160 automatically generates plots based on shape clusters or collapsed groups in addition to non-aesthetic metadata. For example, the exploration engine 160 could generate a scatter plot in which each point "x" had a position that reflected non-aesthetic metadata associated with the design 160(*x*) and a color that reflected the shape cluster to which the design 160(*x*) was assigned. An exemplary illustration of a scatter plot generated by the exploration engine 180 is described in conjunction with FIG. 6.

In various embodiments, the exploration engine 180 automatically analyzes the design space 150 based on metadata that is specific to a generative design flow. Notably, in some embodiments, the exploration engine 180 automatically analyzes the design space 150 based on timelines (not shown). Each timeline is associated with a different final outcome of the generative design flow used to generate the design space 150 and specifies any number of intermediate outcomes that were discarded during the generative design flow. Within a timeline, the intermediate outcomes are ordered by iteration.

As described previously herein, both intermediate outcomes and final outcomes are designs 160 included in the design space 150. However, to reduce information overwhelm, the exploration engine 180 does not typically expose the intermediate outcomes to the user. To enable users to efficiently determine whether any intermediate outcomes may better meet the preferences of the user than any of the final outcomes, the exploration engine 180 provides a timeline tool (not shown) via the design space GUI 182.

For a selected timeline, the timeline tool analyzes the intermediate outcomes along the timeline via proximity and clustering techniques and then visually summarizes the analysis results. More precisely, the timeline tool performs clustering operations on the intermediate outcomes along the timeline based on the shape embeddings 144 to generate shape clusters. Further, for each pair of consecutive (with respect to the timeline) intermediate outcomes, the timeline tool computes the associated distance based on the embeddings 144. If any of the distances exceed a dissimilarity threshold, then the timeline tool determines that at least one of the pair of intermediate outcomes are "interesting." Finally, the timeline tool colors the timeline based on the clusters, generates markers along the timeline that indicate the location of intermediate outcomes, and displays the colored and annotated timeline via the design space GUI 182. Advantageously, automatically analyzing and annotating a timeline in this fashion enables users to evaluate the associated intermediate outcomes in a targeted and efficient fashion.

In the same or other embodiments, the exploration engine 180 may identify interesting intermediate outcomes in any technically feasible fashion, promote any number of the interesting intermediate outcomes to independent designs 160 (i.e., final outcomes), and modify the design space GUI 182 accordingly. As referred to herein, promoting an intermediate output to a design 160 comprises saving the intermediate output as an independent design 160 included in the design space 150. In some alternative embodiments, the generative design flow may not necessarily "hide" intermediate iterations within an expandable timeline.

In alternative embodiments, a generative design flow may not involve iterations that "converge" and instead involve exploring the design space 150 in a relatively random (genetic) fashion. Consequently, the generative design flow may be ordered by a performance measure other than iteration and are not necessarily associated with a timeline. For instances, in some alternative embodiments, the generative design flow may generate one or more sets of intermediate outcomes.

In some alternative embodiments, the training engine 130 may save the decoder 146, including the current machine learning parameters, as a trained decoder. Subsequently, for each design 160(*x*) included in the design space 150, the shape embedding generator 170 generates the shape embedding 144(*x*) based on the trained encoder 172 and the re-construction error (e.g., loss) based on the trained decoder. If the re-construction error for a given design 160(*x*) is higher than a threshold, then the exploration engine 180 may disable any amount of shape-based functionality, such as shape clustering. Further, the exploration engine 180 may add the 3D geometry 122(*x*) associated with the design 160(*x*) to a re-training set used to re-train the autoencoder 140.

Note that the techniques described herein are illustrative rather than restrictive, and may be altered without departing from the broader spirit and scope of the invention. Many modifications and variations will be apparent to those of ordinary skill in the art without departing from the scope and spirit of the described embodiments and techniques. Further, in alternative embodiments, the functionality of the training engine 130, the multi-view engine 132, the autoencoder 140, the shape embedding generator 170, and the exploration engine 180 may be distributed across any number of other applications and components that may or may not be included in the system 100.

Generating Shape Embeddings

Figure 2:
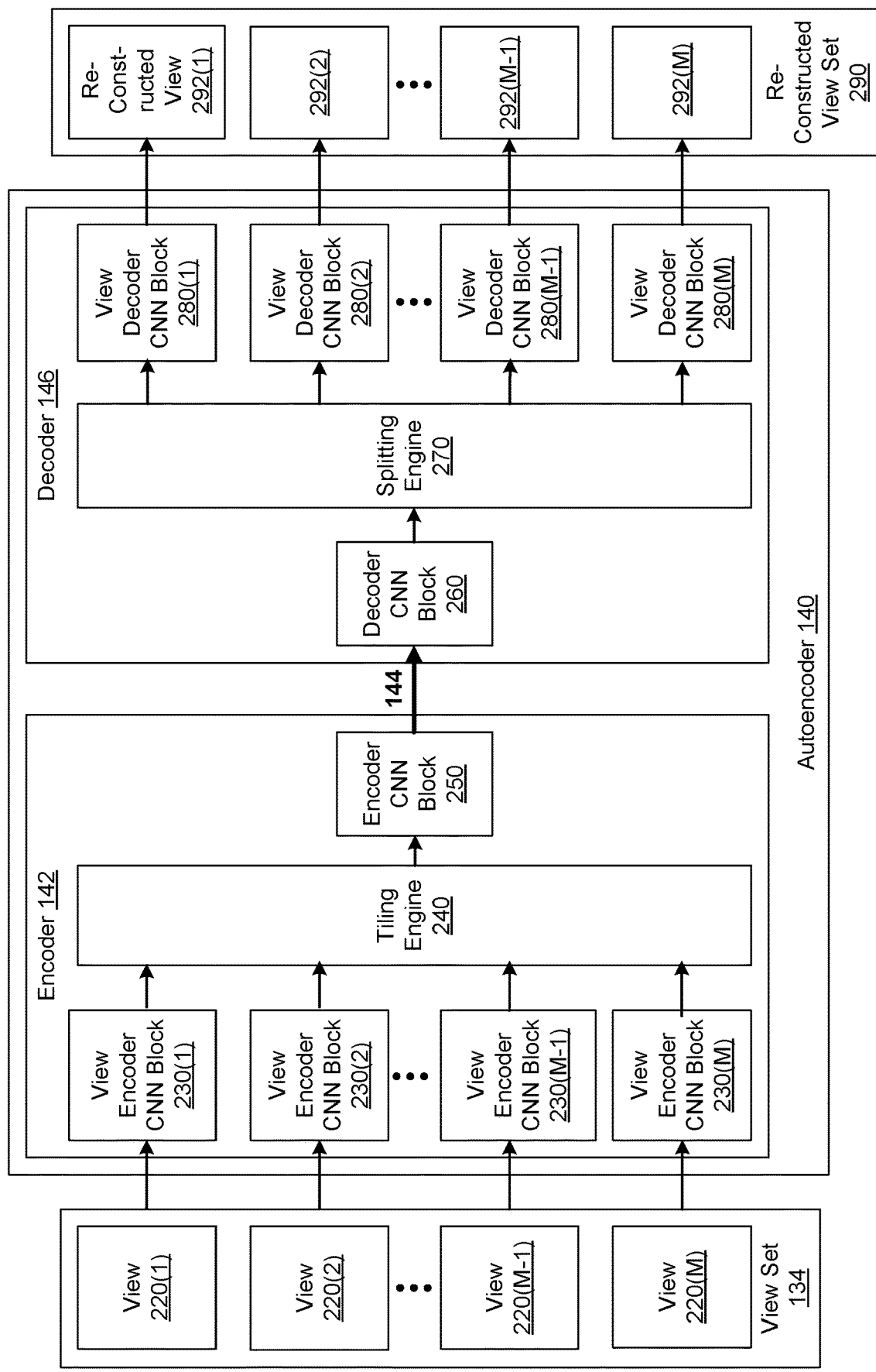
FIG. 2 is a more detailed illustration of the autoencoder of FIG. 1, according to various embodiments of the present invention.

FIG. 2 is a more detailed illustration of the autoencoder 140 of FIG. 1, according to various embodiments of the present invention. As shown, the autoencoder 140 includes, without limitation, the encoder 142 and the decoder 146. In operation, the autoencoder 140 receives the view set 134 and generates a re-constructed view set 290. For explanatory purposes only, FIG. 2 depicts a single view set 134 that is derived from one of the 3D geometries 122 included in the training database 120. As shown, the view set 132 includes, without limitation, views 220(1)-220(M). In a complementary fashion, the re-constructed view set 290 includes, without limitation, re-constructed views 292(1)-292(M). The re-constructed view 292(*x*) is associated with the "original" view 220(*x*).

The encoder 142 receives the view set 132 and generates the shape embedding 144. As shown, the encoder 142 includes, without limitation, a view encoder convolutional neural network (CNN) block 230, a tiling engine 240, and an encoder CNN block 250. As referred to herein, a "CNN block" includes, without limitation, any number (including one) of CNNs in any number of configurations. The view encoder CNN block 230 includes, without limitation, a series of any number and type of CNNs. For each view 220 included in the view set 134, the CNNs included in the view encoder CNN block 230 may implement any number and type machine learning techniques (e.g., convolutions) in any technically feasible fashion to generate an associated view activation (not shown in FIG. 2). Accordingly, the view encoder CNN block 230 generates M different view activations.

For explanatory purposes only, each execution of the view encoder CNN block 230 based on a different view 220 is represented as a separate instance of the view encoder CNN block 230. Accordingly, as referred to herein, the view encoder CNN block 230($x$) executes based on the view 220($x$) to generate a single view activation. In some embodiments, the instances of the view encoder CNN block 230 share the same values for the machine learning parameters, such as weights and biases. In other embodiments, any number of the machine learning parameters for any number of the view encoder CNN blocks 230 may differ from any number of the machine learning parameters for any other of the view encoder CNN blocks 230. For instance, in some embodiments, the view encoder CNN blocks 230(1-5) share one set of weights, whereas the view encoder CNN blocks 230(6-9) share a different set of weights.

Further, the instances of the view encoder CNN block 230 may execute substantially in parallel with one another, sequentially to each other, or any combination thereof. For example, at any given time four different instances of the view encoder CNN block 230 could be executing. First, four instances of the view encoder CNN block 230(1)-230(4) could process the views 220(1)-220(4) substantially in parallel, then four other instances of the view encoder CNN block 230(5)-230(5) could process the views 220(5)-220(8) substantially in parallel, and so forth. In alternative embodiments, a single instance of the view encoder CNN block 230 processes the views 220 substantially in parallel as a single stack of views 220.

The tiling engine 240 receives the M different view activations and generates a single tiled activation (not shown in FIG. 2). More specifically, the tiling engine 240 aggregates the view activations to generate the tiled activation. The tiling engine 240 may aggregate the view activations in any technically feasible fashion. For instance, in some embodiments, the tiling engine 240 concatenates the view activations along a single dimension. Advantageously, by tiling the different view activations, the tiling engine 240 retains the information included in the different view activations. By contrast, as persons skilled in the art will recognize, conventional multi-view encoders typically implement pooling operations that can discard information useful for detecting precise relationships between features. Consequently, the tiling engine 240 increases the accuracy with which the shape embeddings 144 generated by the trained encoder 172 represent the salient visual features of the 3D geometries 122.

The encoder CNN block 250 receives the tiled activation and generates the shape embedding 144. The encoder CNN block 250 includes, without limitation, any number of connected 2D CNNs, followed by any number of fully connected layers. For instance In general, the encoder CNN block 250 may implement any number and type of machine learning techniques in any technically feasible fashion to generate the shape embedding 144 based on the tiled activation. For instance, in some embodiments, the CNN block 250 may include CNNs with 3×3 convolutions to a depth of N weight layers followed by any number of fully connected layers with dropout. In some other embodiments, the CNN block 250 may include any number of connected CNNs followed by a 1×1 convolution layer.

The decoder 146 receives the shape embedding 144 and generates the reconstructed view set 290. The decoder 146 is symmetric with respect to the encoder 142. More precisely, each convolution implemented in the encoder 142 is mirrored with a transposed convolution in the decoder 146. Further the tiling process performed by the encoder 142 is mirrored with a partitioning process performed in the decoder 146. In alternative embodiments, the decoder 146 is not necessarily symmetric with respect to the encoder 142. For instance, in some embodiments, the decoder 146 is less complex than the encoder 142.

As shown, the decoder 146 includes, without limitation, a decoder CNN block 260, a splitting engine 270, and a view decoder CNN block 280. The decoder CNN block 260 includes, without limitation, any number and type of CNNs that implement transposed convolutions relative to the encoder CNN block 240 to generate a decoded tiled activation (not shown) based on the shape embedding 144. The decoder CNN block 260 may implement any number and type of machine learning techniques in any technically feasible fashion to mirror the encoder CNN block 250. For instance, in some embodiments, the decoder CNN block 260 may implement up-sampling convolutions instead of transposed convolutions. In alternative embodiments, the decoder CNN block 260 may implement any number and type of convolutions in any technically feasible fashion and is not necessarily symmetrical with respect to the encoder CNN block 250.

The splitting engine 270 performs any number and type of partitioning operations to generate M different decoded view activations (not shown) based on the decoded tiled activation. Each of the decoded view activations corresponds to a different view 220 included in the view set 134. For each decoded view activation, the view decoder CNN block 280 implements transposed convolutions relative to the view encoder CNN block 230 to generate a different re-constructed view 292 included in the re-constructed view set 290. In particular, the view decoder CNN block 280 may implement any number and type of machine learning techniques in any technically feasible fashion to mirror the view encoder CNN block 230. For instance, in some embodiments, the view decoder CNN block 280 may implement up-sampling convolutions instead of transposed convolutions. In alternative embodiments, the view decoder CNN block 280 may implement any number and type of convolutions in any technically feasible fashion and is not necessarily symmetrical with respect to the view encoder CNN block 230.

For explanatory purposes only, each execution of the view decoder CNN block 280 on a different decoded view activation is represented as a separate instance of the view decoder CNN block 280. In general, the instances of the view decoder CNN block 280 may execute substantially in parallel with one another, sequentially to each other, or any combination thereof. However, the instances of the view decoder CNN block 280 share the same values for the machine learning parameters, such as weights and biases.

In alternative embodiments, a single instance of the view decoder CNN block 280 processes the decoded view activations substantially in parallel as a single stack of decoded view activations. In the same or other alternative embodiments, any number of the machine learning parameters for any number of the view decoder CNN blocks 280 may differ from any number of the machine learning parameters for any other of the view decoder CNN block 280. For instance, in some embodiments, the view decoder CNN block 280(1-5) share one set of weights, whereas the view decoder CNN blocks 280(6-9) share a different set of weights.

Figure 3:
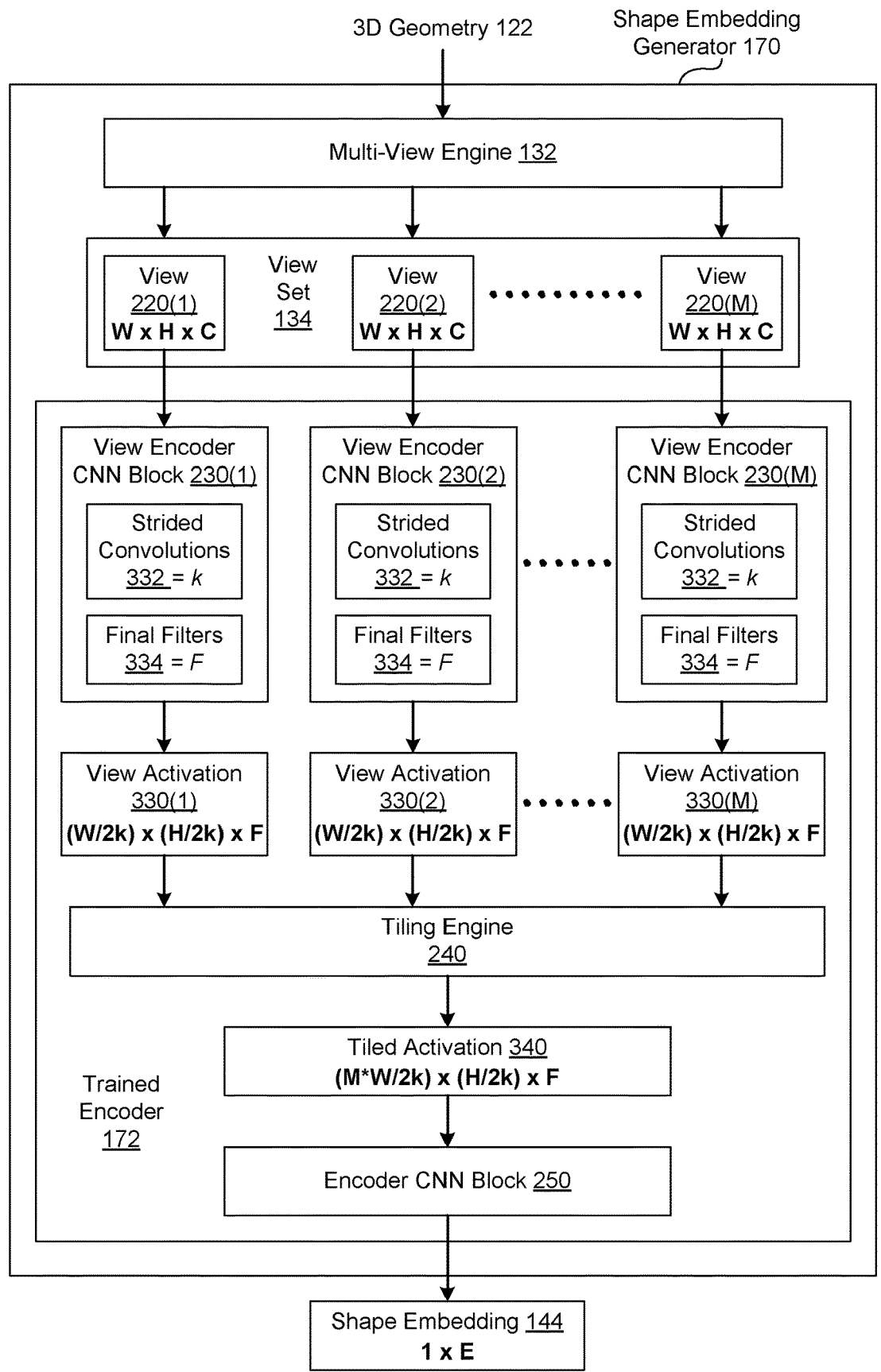
FIG. 3 is a more detailed illustration of the shape embedding generator of FIG. 1, according to various embodiments of the present invention.

FIG. 3 is a more detailed illustration of the shape embedding generator 170 of FIG. 1, according to various embodiments of the present invention. The shape embedding generator 170 maps the 3D geometry 122 to the shape embedding 144 that represents the shape of the 3D geometry 122 as a fixed-size vector. As shown, the shape embedding generator 170 includes, without limitation, the multi-view engine 132 and the trained encoder 172. As described in conjunction with FIG. 1, the multi-view engine 132 generates the view set 134 based on the 3D geometry 122. For explanatory purposes only, the view set 134 includes, without limitation, M different views 220(1)-220(M). Each of the views 220 has a dimension of HxWxC, where H is the height, W is the width, and C is the number of channels associated with the view 220.

The trained encoder 172 is the trained version of the encoder 142 of FIG. 2. As shown, the trained encoder 172 includes, without limitation, M instances of the view encoder CNN block 230, the tiling engine 240, and the encoder CNN block 250. In operation, the view encoder CNN block 230(x) generates a view activation 330(x) based on the view 220(x). The view encoder CNN block 230 includes, without limitation, "k" strided convolutions 332 and "F" final filters 335. More precisely, "k" specifies the number of strided convolutions 332 included in the view encoder CNN block 230 and F specifies the number of filters included in the final convolution layer included in the view encoder CNN block 230. Accordingly, the view encoder CNN block 230(x) generates the view activation 330(x) having a dimension of (W/2k)x(H/2k)xF.

After the view encoder block 230 has finished generating the view activations 330(1)-330(M), the tiling engine 240 concatenates the view activations 330(1)-330(M) widthwise to generate a tiled activation 340. As shown, the tiled activation 340 is a tensor having a dimension of (M*W/2k)x(H/2k)xF. Finally, the encoder CNN block 250 generates the embedding 144. The embedding 144 has a dimension of 1xE, where E is a fixed-size (e.g., 512). The fixed-size E may be predetermined in any technically feasible fashion. For instance, the size of E may be determined empirically based on any combination of accuracy and performance criteria.

For explanatory purposes only, FIG. 3 depicts exemplary relationships between dimensions, parameters, parameter values, etc., within the shape embedding generator 170. In alternative embodiments, the dimensions, parameters, values, etc., themselves as well as the relationships between the dimensions, parameters, values, etc., may vary. For instance, in various embodiments, the dimension of the view activation 330(x) generated by view encoder CNN block 230(x) is not dependent on a number of strided convolutions.

Figure 4:
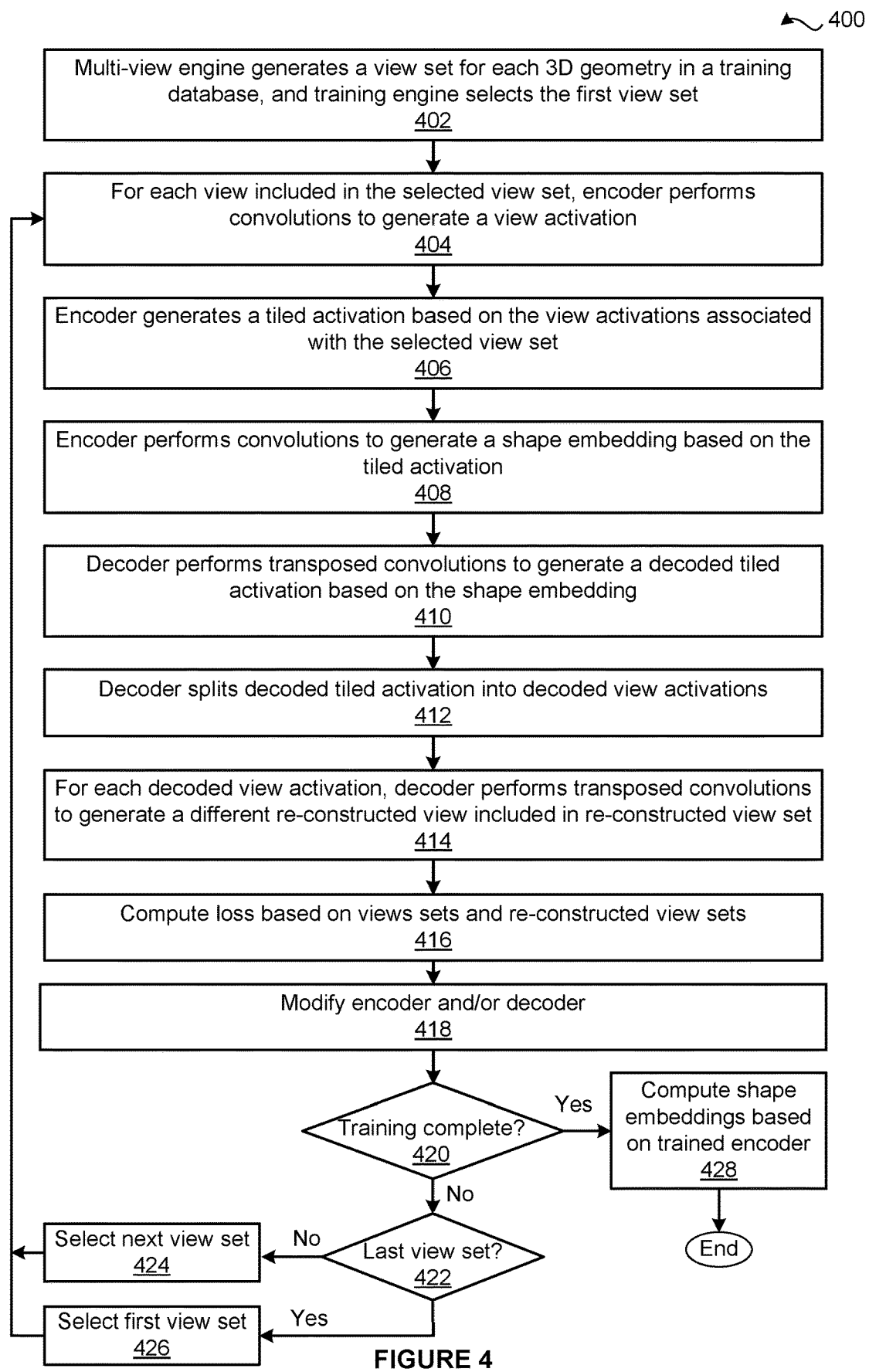
FIG. 4 is a flow diagram of method steps for generating a computational representation of the shape of a 3D geometry shape, according to various embodiments of the present invention.

FIG. 4 is a flow diagram of method steps for generating a computational representation of 3D geometry shape. Although the method steps are described with reference to the systems of FIGS. 1-3, persons skilled in the art will understand that any system configured to implement the method steps, in any order, falls within the scope of the present invention.

As shown, a method 400 begins at step 402, where the multi-view engine 132 generates a different view set 134(x) for each 3D geometry 122(x) included in the training database 120. The training engine 130 then selects the first view set 134. The first view set 134 includes the views 220(1)-220(M). At step 404, for each view 220(y) included in the selected view set 134, the view encoder CNN block 230 performs convolutions to generate a view activation 330(y). At step 406, the tiling engine 240 concatenates the view activations 330 associated with the selected view set 134 to generate the tiled activation 340(x). At step 408, the encoder CNN block 250 performs convolutions to generate the shape embedding 144(x) based on the tiled activation 340(x).

At step 410, the decoder CNN block 260 performs transposed convolutions to generate a decoded tiled activation based on the shape embedding 144(x). At step 412, the splitting engine 270 partitions the decoded tiled activation into M decoded view activations. At step 414, for each decoded view activation, the view decoder CNN block 280 performs transposed convolutions to generate a different re-constructed view 292 included in the re-constructed view set 290 associated with the selected view set 134.

At step 416, the training engine 130 computes the loss based on the view sets 230 and the re-constructed view sets 290. At step 418, the training engine 130 modifies the encoder 142 and/or the decoder 146 based on the loss. At step 420, the training engine 130 determines whether the training of the autoencoder 140 is complete. The training engine 130 may determine whether the training of the autoencoder 140 is complete in any technically feasible fashion. For instance, in some embodiments, the training engine 130 may compare the loss to a maximum acceptable loss.

If, at step 420, the training engine 130 determines that the training of the autoencoder 140 is not complete, then the method proceeds to step 422. At step 422, the training engine 130 determines whether the selected view set 290 is the last view set 290 associated with the training database 120. If, at step 422, the training engine 130 determines that the selected view set 290 is not the last view set 290 associated with the training database 120, then the method 400 proceeds to step 424. At step 424, the training engine 130 selects the next view set 290 associated with the training database 120. The method 400 then returns to step 404, where the autoencoder 140 generates the re-constructed view set 290 associated with the selected view set 134.

If, however, at step 422, the training engine 130 determines that the selected view set 290 is the last view set 290 associated with the training database 120, then the method 400 proceeds directly to step 426. At step 426, the training engine 130 selects the first view set 290 associated with the training database 120. The method 400 then returns to step 404, where the autoencoder 140 generates the re-constructed view set 290 associated with the first view set 134.

Returning now to step 420, if the training engine 130 determines that the training of the autoencoder 140 is complete, then the method proceeds directly to step 428. At step 428, the training engine 130 saves the encoder 142 as the trained encoder 172. The shape embedding generator 170 generates shape embeddings 144 for each of the designs 160 in the design space 150 based on the trained encoder 172. Subsequently, the exploration engine 180 facilitates aesthetics-based visual exploration of the design space based on the shape embeddings 144. The method 400 then terminates.

Exploring Design Spaces Based on Shape Embeddings

Figure 5:
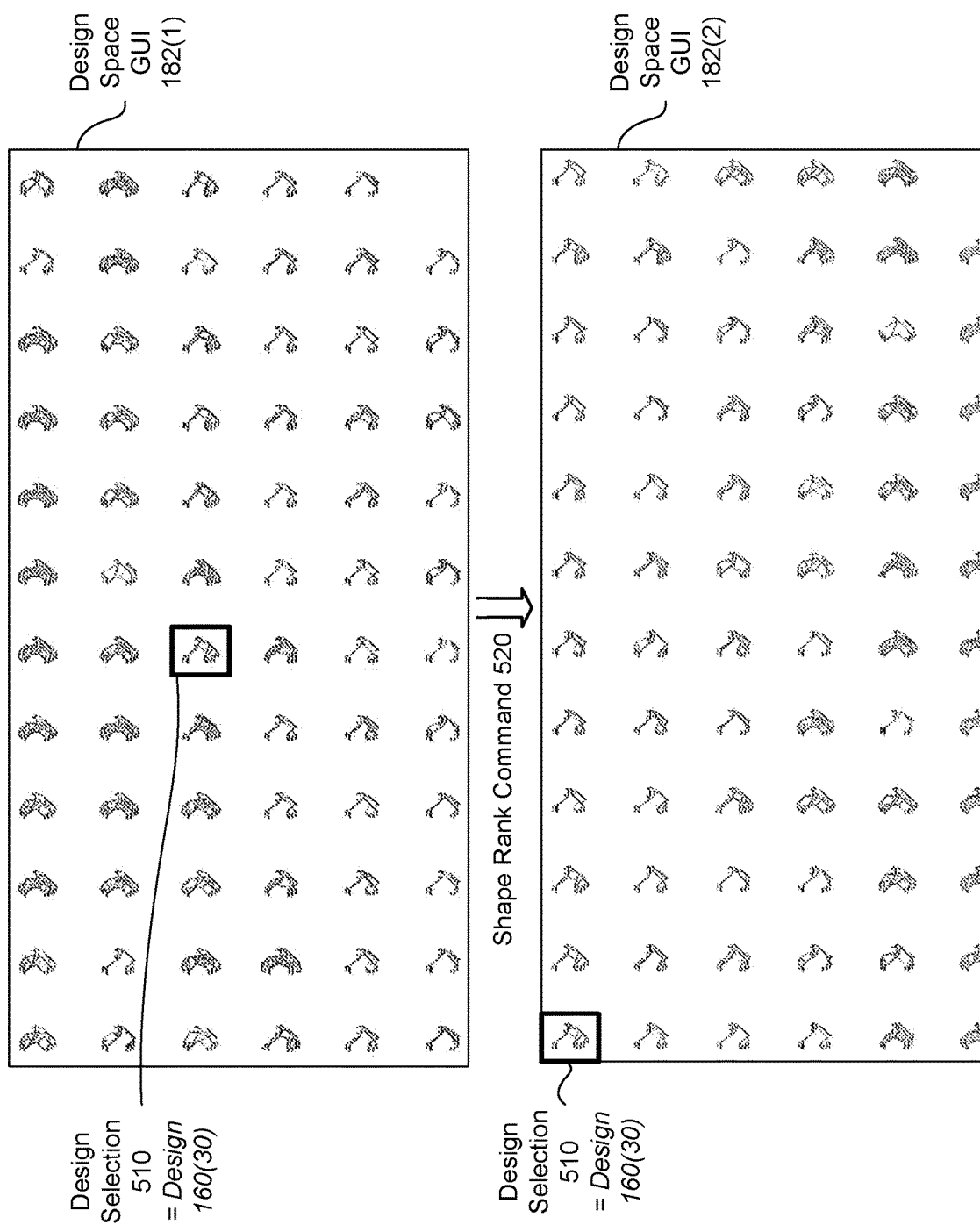
FIG. 5 is an exemplary illustration of the design space graphical user interface (GUI) of FIG. 1, according to various embodiments of the present invention.

FIG. 5 is an exemplary illustration of the design space graphical user interface (GUI) 182 of FIG. 1, according to various embodiments of the present invention. In particular, FIG. 5 depicts the design space GUI 182 at two different points in time while executing a shape rank command 520, For explanatory purposes only, the design space 150 includes, without limitation, 61 different designs 160(1)-160(61). The design space GUI 182 visually represents the 61 different designs as 61 different thumbnails.

The design space GUI 182(1) is a snapshot of the design space GUI 182 at a point in time before the exploration engine 180 executes the shape rank command 520. As a design selection 510 depicts, a single design 160(30) is selected. Subsequently, the exploration engine 180 executes the shape rank command 520 based on the selected design 160 and the 61 different shape embeddings 144(1)-144(61) associated with, respectively, the 61 different designs 160(1)-160(61).

The design space GUI 182(2) is a snapshot of the design space GUI 182 at a point in time after the exploration engine 180 has finished executing the shape rank command 520 and has re-generated the design space GUI 182. The first row includes the 12 highest ranked designs, ordered from left to right. The next row includes the 12 next highest ranked designs, and so forth. Accordingly, the top left design is the design 160(30), indicating that the shape of the design 160(30) best matches itself. By contrast, the shape of the bottom right design 160 is significantly dissimilar to the shape of the design 160(30).

As illustrated by FIG. 5, automatically ranking the designs 160 based on shape enables users to efficiently explore the design space 150. Notably, in embodiments in which the design space 150 is associated with a generative design flow, the design space 150 may contain tens of thousands of different designs 160. By selecting a current "favorite" design 160 and ranking the other designs 160 relative to the favorite design 160, the user can perform a highly targeted and, consequently, effective search across the tens of thousands of designs 160.

Figure 6:
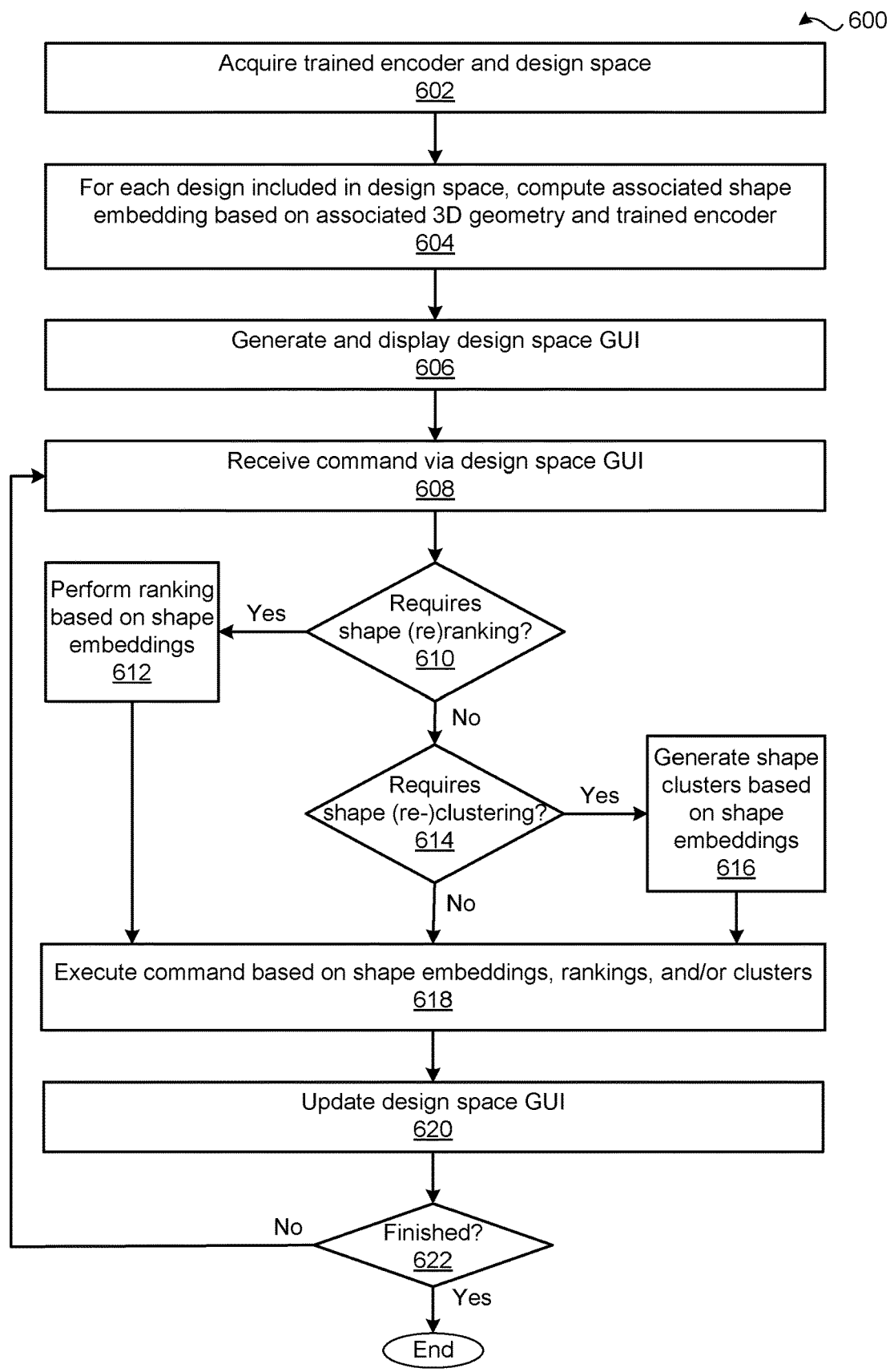
FIG. 6 is a flow diagram of method steps for automatically exploring a design space, according to various embodiments of the present invention.

FIG. 6 is a flow diagram of method steps for automatically exploring a design space, according to various embodiments of the present invention. More specifically, FIG. 6 is a flow diagram of method steps for automatically exploring a design space based on the shapes of 3D designs. Although the method steps are described with reference to the systems of FIGS. 1-3 and FIG. 5, persons skilled in the art will understand that any system configured to implement the method steps, in any order, falls within the scope of the present invention.

As shown, a method 600 begins at step 602, where the shape embedding generator 170 acquires the trained encoder 172 and the design space 150. At step 604, for each design 160(x) included in the design space 150, the shape embedding generator 170 generates the shape embedding 144(x) based on the associated 3D geometry 122(x) and the trained encoder 172. At step 606, the exploration engine 180 generates and displays the design space GUI 182. At step 608, the exploration engine 180 receives a command via the design space GUI 182.

At step 610, the exploration engine 180 determines whether the command involves (re)ranking based on shape. If, at step 610, the exploration engine 160 determines that the command involves (re)ranking based on shape, then the method 600 proceeds to step 612. At step 612, the exploration engine 160 (re)ranks the designs 160, the shape clusters, and/or the collapsed groups based on the shape embeddings 144. The method 600 then proceeds directly to step 618.

If, however, at step 610, the exploration engine 160 determines that the command does not involve (re)ranking based on shape, then the method 600 proceeds directly to step 614. At step 614, the exploration engine 160 determines whether the command involves shape (re-)clustering. If, at step 614, the exploration engine 160 determines that the command involves shape (re-)clustering, then the method 600 proceeds to step 616. At step 612, the exploration engine 160 generates shape clusters based on the shape embeddings 144. The method 600 then proceeds directly to step 618. If, however, at step 614, the exploration engine 160 determines that the command does not involve shape (re)clustering, then the method 600 proceeds directly to step 618.

At step 618, the exploration engine 160 executes the command based on the shape embeddings 144, rankings, and/or shape clusters. At step 620, the exploration engine 160 updates the design space GUI 182 based on the results of the command. At step 622, the exploration engine 160 determines whether the user has finished exploring the design space 150. The exploration engine 160 may determine whether the user has finished exploring the design space 150 in any technically feasible fashion.

For example, if the exploration engine 160 determines that the user has attempted to exit the design space GUI 182, then the exploration engine determines that the user has finished exploring the design space 150. If, at step 622, the exploration 160 determines that user has not finished exploring the design space 150, then the method 600 returns to step 608, where the exploration engine 160 receives and processes the next command. If, however, at step 622, the exploration engine determines that the user has finished exploring the design space 150, then the method 600 terminates.

Figure 7:
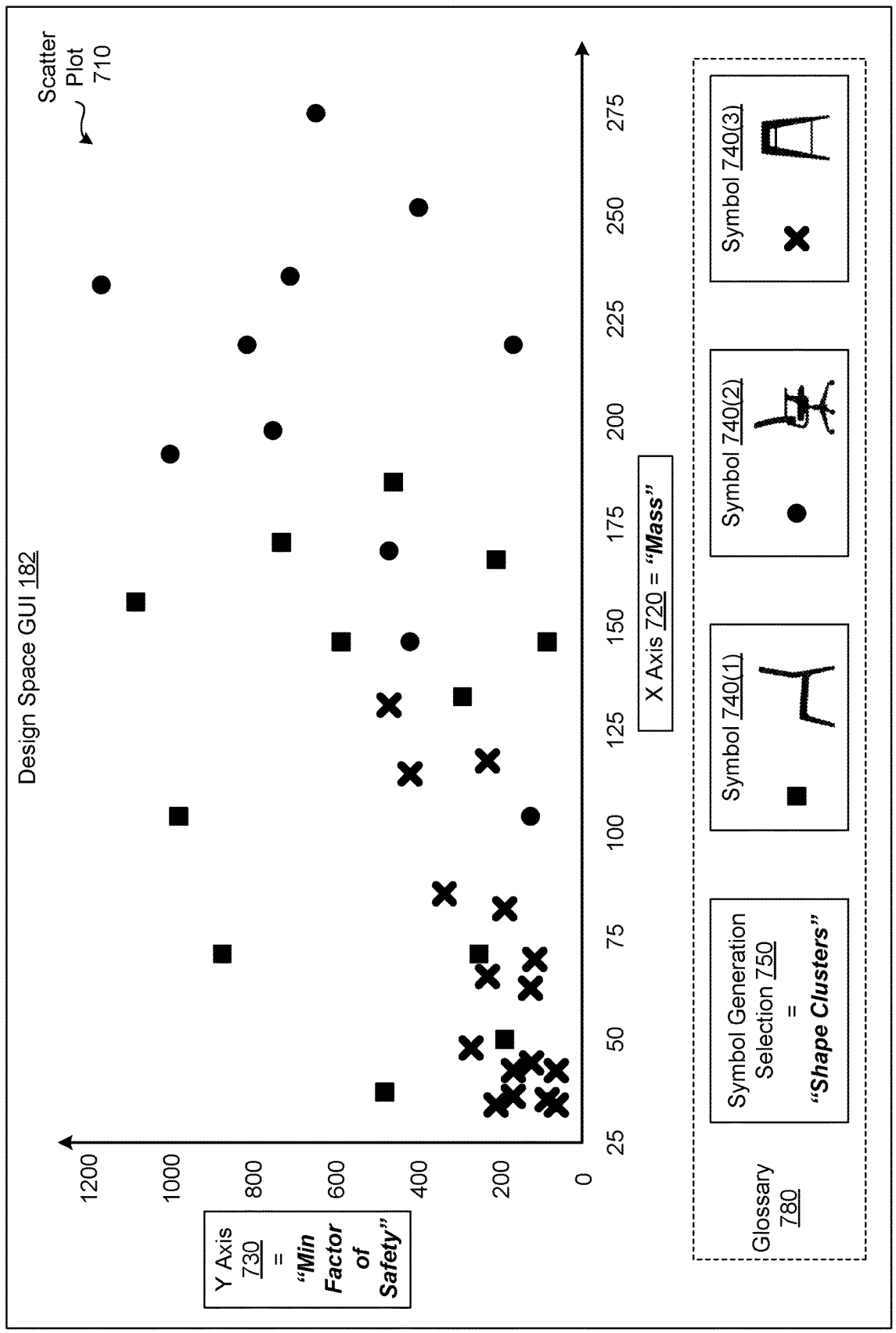
FIG. 7 is an exemplary illustration of a scatter plot generated by the exploration engine of FIG. 1, according to various embodiments of the present invention.

FIG. 7 is an exemplary illustration of a scatter plot 710 generated by the exploration engine 180 of FIG. 1, according to various embodiments of the present invention. As shown, the scatter plot 710 is displayed via the design space GUI 182. The scatter plot 710 includes, without limitation, an x axis 720, a y axis 730, and a glossary 780.

For explanatory purposes only, the x axis 720 and the y axis 730 are configured to represent non-aesthetic data associated with the designs 160. More specifically, the x axis 720 is configured to represent the mass of the designs 160, and the y axis is configured to represent a minimum (min) factor of safety associated with the designs 160. The glossary 780 includes, without limitation, a symbol generation selection 750 and any number of symbols 740. The symbol generation selection 750 is set to "shape clusters" to indicate that each different shape cluster is to be represented by a different symbol in the scatter plot 710.

As shown, the glossary 780 visually defines each of the symbols 740(x) via a thumbnail of a representative design 160 included in the associated shape cluster. The symbol 740(1) of a filled square is associated with a shape cluster that includes basic chairs having neither wheels nor arms. The symbol 740(2) of a filled circle is associated with a shape cluster that includes office chairs having both wheels and arms. The symbol 740(3) of a cross is associated with a shape cluster that includes stools.

In operation, for a given design 160, the exploration engine 180 determines an associated plot position based on non-aesthetic metadata associated with the design 160. The exploration engine 180 also determines an associated plot symbol for the design 160 based on the shape cluster to which the design 160 is assigned. Finally, the exploration engine 180 generates the scatter plot 710, representing each design 160 within the scatter plot based on the associated plot position and the associated plot symbol.

In alternative embodiments, the exploration engine 180 may assign any type of distinguishing information to different shape clusters in any technically feasible fashion. For instance, in some embodiments, the exploration engine 180 names and colors each of the shape clusters arbitrarily. In the same or other embodiments, the exploration engine 180 does not generate the glossary 780 and, consequently, the scatter plot 710 does not include the glossary 780.

Advantageously, the scatter plot 710 enables the user to efficiently trade-off various functional and non-functional criteria and identify designs 160 that might best represent the preferences of the user. For example, after viewing the scatter plot 710, a user that was previously considering only stools could observe that the lightest basic chair and the lightest stool have similar masses. Further, the user could observe that the minimum factor of safety for the lightest basic chair is higher than the minimum factor of safety for the lightest stool. Accordingly, the user could select the lightest basic chair for production instead of the lightest stool.

Figure 8:
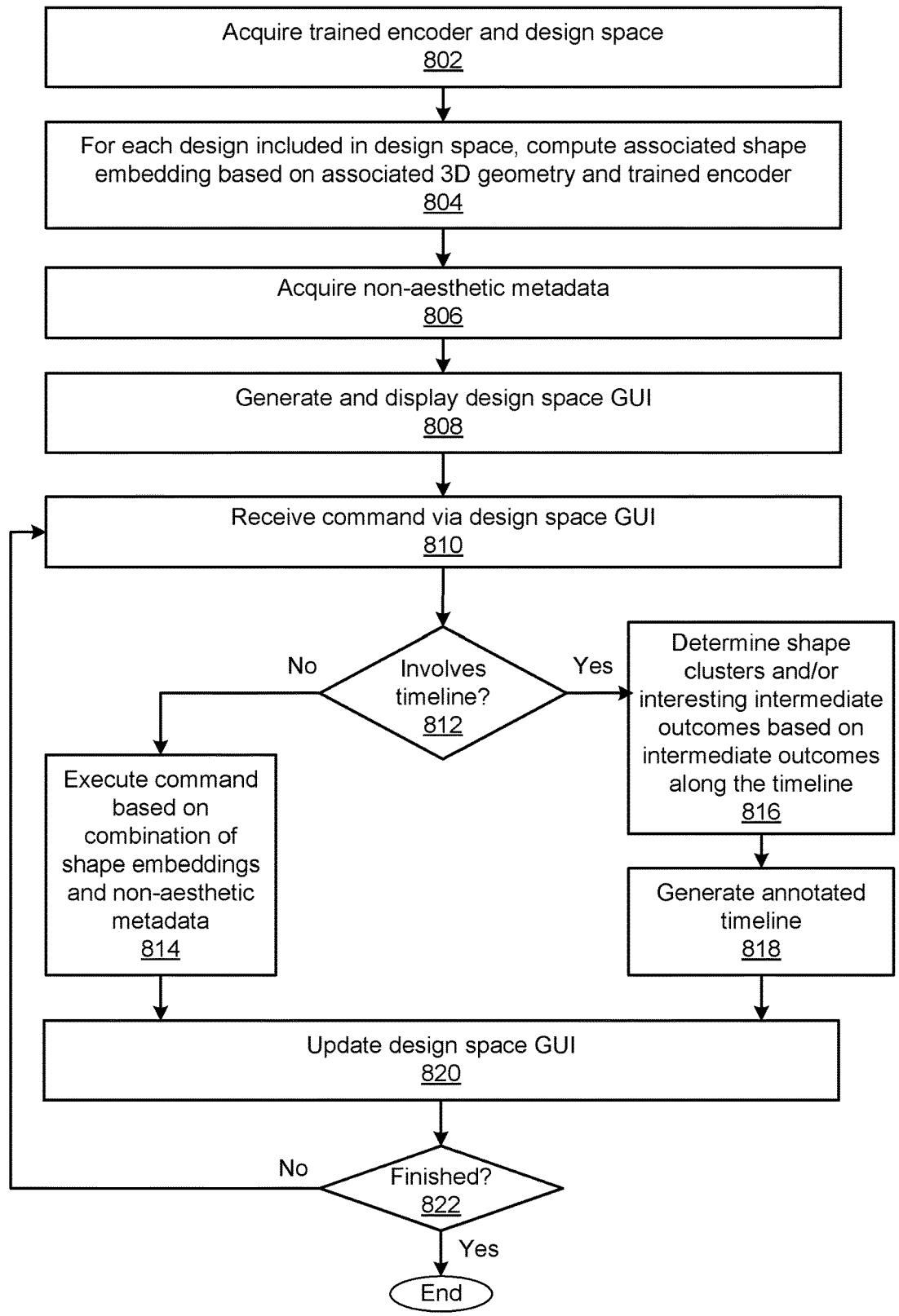
FIG. 8 is a flow diagram of method steps for automatically exploring a design space, according to various other embodiments of the present invention.

FIG. 8 is a flow diagram of method steps for automatically exploring a design space, according to various other embodiments of the present invention. In particular, FIG. 8 is a flow diagram of method steps for automatically exploring a design space based on a combination of shape embeddings and non-aesthetic metadata. Although the method steps are described with reference to the systems of FIGS. 1-3 and FIG. 7, persons skilled in the art will understand that any system configured to implement the method steps, in any order, falls within the scope of the present invention.

As shown, a method 800 begins at step 802, where the shape embedding generator 170 acquires the trained encoder 172 and the design space 150. At step 804, for each design 160(x) included in the design space 150, the shape embedding generator 170 generates the shape embedding 144(x) based on the associated 3D geometry 122(x) and the trained encoder 172. At step 806, the exploration engine 180 acquires any amount and type of additional non-aesthetic metadata associated with the designs 160, the design space 150, and/or a design flow associated with the design space 150. At step 808, the exploration engine 180 generates and displays the design space GUI 182. At step 810, the exploration engine 180 receives a command via the design space GUI 182.

At step 812, the exploration engine 180 determines whether the command involves a timeline associated with a generative design flow. If, at step 812, the exploration engine 180 determines that the command does not involve a timeline associated with a generative design flow, then the method 800 proceeds to step 814. At step 814, the exploration engine 160 executes the command based on a combination of the shape embeddings 144 and non-aesthetic metadata. The method 800 then proceeds directly to step 820.

If, however, at step 812, the exploration engine 160 determines that the command involves a timeline associated with a generative design flow, then the method 800 proceeds directly to step 816. At step 816, the exploration engine 160 determines shape clusters and/or interesting intermediate outcomes based on intermediate outcomes along the time line. More precisely, the exploration engine 160 determines the shape clusters based on the shape embeddings 144 associated with the intermediate outcomes along the timeline. In general, the exploration engine 160 may determine interesting intermediate outcomes in any technically feasible fashion based on any amount and type of information. For instance, the exploration engine 160 may determine the interesting intermediate outcomes based on metatdata and/or the shape embeddings 144. At step 818, the exploration engine 160 generates an annotated timeline based on the shape clusters and the interesting intermediate outcomes.

At step 820, the exploration engine 160 updates the design space GUI 182 based on the results of the command. At step 822, the exploration engine 160 determines whether the user has finished exploring the design space 150. The exploration engine 160 may determine whether the user has finished exploring the design space 150 in any technically feasible fashion.

For example, if the exploration engine 160 determines that the user has attempted to exit the design space GUI 182, then the exploration engine determines that the user has finished exploring the design space 150. If, at step 822, the exploration 160 determines that user has not finished exploring the design space 150, then the method 800 returns to step 810, where the exploration engine 160 receives and processes the next command. If, however, at step 822, the exploration engine determines that the user has finished exploring the design space 150, then the method 800 terminates.

In sum, the disclosed techniques may be used to generate shape embeddings that efficiently and accurately represent the shapes of 3D designs. For each 3D geometry included in a training database, a training engine renders the 3D geometry based on multiple virtual cameras to generate different depth views included in a view set associated with the 3D geometry. The training engine then trains a multi-view variational autoencoder to losslessly compress each view set into a shape embedding and subsequently expand the shape embedding to generate a re-constructed view set. During the training, an encoder included in the autoencoder generates a shape embedding based on a view set and a decoder included in the autoencoder generates a re-constructed view set based on the shape embedding.

The encoder includes, without limitation, multiple instances of a view encoder convolutional neural network (CNN) block, a tiling engine, and an encoder CNN block. For each view included in a given set of views, a different instance of the view encoder CNN block generates a view activation. The tiling engine concatenates the different view activations width-wise to generate a tiled activation. Subsequently, the encoder CNN block generates a shape embedding based on the tiled activation. Notably, the shape embedding is a fixed size vector that robustly represents the visual structure of the 3D geometry associated with the set of views, irrespective of the format, the complexity, and any tessellation associated with the 3D geometry. The decoder is symmetric with respect to the encoder. More precisely, each convolution in the encoder is mirrored with a transposed convolution in the decoder. Further the tiling process performed by the encoder is mirrored with a partitioning process performed by the decoder. Within the autoencoder, the decoder operates sequentially to the encoder and generates a re-constructed view set based on the shape embedding.

To train the autoencoder, the training engine implements a loss function that penalizes deviations of the re-constructed views from the associated "original" views. After determining that the re-constructed views are sufficiently similar to the original views across the training database, the training engine discards the decoder and saves the encoder as a trained encoder. In general, the trained encoder maps a set of views associated with a 3D geometry to a fixed-length shape embedding that accurately and efficiently represents the visual shape of the 3D geometry. Notably, the shape embeddings enable efficient aesthetic comparisons between the 3D geometries. In particular, a distance between each shape embedding on the shape embedding manifold indicates a degree of visual similarity.

In various embodiments, a shape embedding engine and an exploration engine facilitate the aesthetic exploration of a design space based on the shape embeddings. For each 3D design included in the design space, the shape embedding engine computes and stores an associated shape embedding based on the trained encoder. The exploration engine provides a design space graphical user interface (GUI) that receives commands from users, processes the commands, and visually displays the results of the commands. Notably, the commands may include any number and type of aesthetic analysis commands that the exploration engine executes based on the shape embeddings. Notably, because the shape embeddings are fixed-length vectors, the shape embeddings are amenable to a wide variety of data analysis operations. Examples of data analysis operations include, without limitation, comparison operations, clustering operations, ranking operations, and filtering operations, to name a few.

In the same or other embodiments, the exploration engine facilitates the exploration of a design space based on shape embeddings in conjunction with non-aesthetic aspects of the designs, aspects of the design space, and/or aspects of a generative design process associated with the design space. For instance, the exploration engine may analyze and visually annotate a timeline associated with a generative design flow based on the shape embeddings associated with intermediate outcomes (e.g., designs along the timeline).

Advantageously, by implementing machine learning operations to train an autoencoder based on an extensive training database of 3D designs, the training application enables robust and efficient representations of the visual shape of 3D geometries. In particular, by preserving information for each of multiple views of a 3D geometry throughout the encoding process, the trained encoder generates a shape embedding that accurately represents one or more salient visual features of the 3D geometry. Further, because the shape embedding has a fixed size, the shape embedding is amenable to efficient data analysis operations across the relatively large number of geometrically complex 3D designs typically associated with generative design flows. Accordingly, a CAD tool can automatically compare shape embeddings to allow a user to efficiently and subjectively explore a design space associated with a generative design flow based on aesthetic and non-aesthetic preferences. As a result, the likelihood that a user unintentionally overlooks designs that better reflect the aesthetic preferences of the user when selecting a design for production is substantially reduced compared to prior art approaches. These technical advantages provide one or more technological advancements over the prior art.

In some embodiments, a computer-implemented method for generating computational representations for three-dimensional (3D) geometry shapes comprises, for each view included in a first plurality of views associated with a first 3D geometry, generating a view activation based on a first convolutional neural network (CNN) block; aggregating the view activations to generate a first tiled activation; generating a first shape embedding having a fixed size based on the first tiled activation and a second CNN block; generating a first plurality of re-constructed views based on the first shape embedding; performing one or more training operations on at least one of the first CNN block and the second CNN block based on the first plurality of views and the first plurality of re-constructed views to generate a trained encoder; and generating a second shape embedding having the fixed size based on the trained encoder.

The method of clause 1, wherein aggregating the view activations comprises concatenating the view activations along a single dimension.

The method of clauses 1 or 2, wherein the second CNN block includes one or more 2D CNNs followed by a fully connected layer.

The method of any of clauses 1-3, wherein performing the one or more training operations comprises determining that the first CNN block is not trained based on a loss function; modifying one or more machine learning parameters associated with the first CNN block based on the loss function to generate a third CNN block; generating a second plurality of re-constructed views based on the third CNN block and the second CNN block; and determining that the third CNN block and the second CNN block comprise the trained encoder based on the loss function; the first plurality of views; and the second plurality of re-constructed views.

The method of any of clauses 1-4, wherein generating the first plurality of re-constructed views comprises generating a decoded tiled activation based on the first shape embedding and a third CNN block; partitioning the decoded tiled activation into a plurality of decoded view activations; and for each decoded view activation included in the plurality of decoded view activations, generating a different re-constructed view included in the first plurality of re-constructed views based on a fourth CNN block.

The method of any of clauses 1-5, further comprising modifying one or more machine learning parameters associated with a fifth CNN block based on a loss function to generate the third CNN block.

The method of any of clauses 1-6, further comprising, for each virtual camera included in a plurality of virtual cameras, rendering the first 3D geometry based on the virtual camera to generate a different view included in the first plurality of views.

The method of any of clauses 1-7, wherein generating a first view activation included in the view activations occurs at least partially in parallel with generating a second view activation included in the view activations.

The method of any of clauses 1-8, wherein the second shape embedding is associated with a 3D design that is automatically generated via a generative design flow.

The method of any of clauses 1-9, wherein the second shape embedding is associated with a second 3D geometry, and further comprising generating a third shape embedding having the first size based on the trained encoder and a third 3D geometry; and performing one or more comparison operations between the second shape embedding and the third shape embedding when exploring a design space.

In some embodiments, one or more non-transitory computer readable media include instructions that, when executed by one or more processors, cause the one or more processors to perform the steps of, for each view included in a first plurality of views associated with a first 3D geometry, generating a view activation based on a first convolutional neural network (CNN) block; aggregating the view activations to generate a first tiled activation; generating a first shape embedding having a fixed size based on the first tiled activation and a second CNN block; generating a first plurality of re-constructed views based on the first shape embedding; performing one or more training operations on at least one of the first CNN block and the second CNN block based on the first plurality of views and the first plurality of re-constructed views to generate a trained encoder; and generating a second shape embedding having the fixed size based on the trained encoder.

The one or more non-transitory computer readable media of clause 11, wherein aggregating the view activations comprises concatenating the view activations along a single dimension.

The one or more non-transitory computer readable media of clauses 11 or 12, wherein the second CNN block includes one or more 2D CNNs followed by a fully connected layer.

The one or more non-transitory computer readable media of any of clauses 11-13, wherein performing the one or more training operations comprises determining that the first CNN block is not trained based on a loss function; modifying one or more machine learning parameters associated with the first CNN block based on the loss function to generate a third CNN block; generating a second plurality of re-constructed views based on the third CNN block and the second CNN block; and determining that the third CNN block and the second CNN block comprise the trained encoder based on the loss function; the first plurality of views; and the second plurality of re-constructed views.

The one or more non-transitory computer readable media of any of clauses 11-14, wherein the loss function measures a difference between a plurality of views and a plurality of re-constructed views.

The one or more non-transitory computer readable media of any of clauses 11-15, wherein generating the first plurality of re-constructed views comprises performing a first set of convolution operations on the first shape embedding to generate a decoded tiled activation; partitioning the decoded tiled activation into a plurality of decoded view activations; and for each decoded view activation included in the plurality of decoded view activations, performing a second set of convolution operations on the decoded view activation to generate a different re-constructed view included in the first plurality of re-constructed views.

The one or more non-transitory computer readable media of any of clauses 11-16, wherein each view included in the first plurality of views comprises a different rendering.

The one or more non-transitory computer readable media of any of clauses 11-17, wherein generating a first view activation included in the view activations occurs at least partially in parallel with generating a second view activation included in the view activations.

The one or more non-transitory computer readable media of any of clauses 11-18, wherein the second shape embedding is associated with a second 3D geometry, and further comprising generating a third shape embedding having the first size based on the trained encoder and a third 3D geometry; and performing one or more comparison operations between the second shape embedding and the third shape embedding when exploring a design space.

In some embodiments, a system comprises one or more memories storing instructions; and one or more processors that are coupled to the one or more memories and, when executing the instructions, are configured to, for each view included in a first plurality of views associated with a first 3D geometry, generate a view activation based on a first convolutional neural network (CNN) block; aggregate the view activations to generate a first tiled activation; generate a first shape embedding having a fixed size based on the first tiled activation and a second CNN block; generate a first plurality of re-constructed views based on the first shape embedding; perform one or more training operations on at least one of the first CNN block and the second CNN block based on the first plurality of views and the first plurality of re-constructed views to generate a trained encoder; and generate a second shape embedding having the fixed size based on the trained encoder.

Any and all combinations of any of the claim elements recited in any of the claims and/or any elements described in this application, in any fashion, fall within the contemplated scope of the present invention and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module" or "system." In addition, any hardware and/or software technique, process, function, component, engine, module, or system described in the present disclosure may be implemented as a circuit or set of circuits. Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine. The instructions, when executed via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A computer-implemented method for training a neural network to generate representations of three-dimensional (3D) shapes, the method comprising:
    for each view included in a plurality of views associated with a first 3D geometry, performing one or more convolutions to generate a view activation;
    generating a tiled activation based on the view activations;
    performing one or more convolutions on the tiled activation to generate a shape embedding having a fixed size, wherein a plurality of other shape embeddings generated based on a plurality of other 3D geometries also have the fixed size;
    performing one or more transposed convolutions on the shape embedding to generate a decoded tiled activation;
    splitting the decoded tiled activation into a plurality of decoded view activations; and
    for each decoded view activation, performing one or more transposed convolutions to generate at least one reconstructed view associated with the first 3D geometry.

2. The computer-implemented method of claim 1, wherein the shape embedding includes a first vector having the fixed size that is based on the tiled activation.

3. The computer-implemented method of claim 2, wherein the fixed size is selected to control an amount of compute resources used when comparing the shape embedding to another shape embedding generated for a second 3D geometry.

4. The computer-implemented method of claim 1, further comprising computing a loss based on the plurality of views and the plurality of reconstructed views.

5. The computer-implemented method of claim 4, further comprising modifying at least one of an encoder or a decoder based on the loss.

6. The computer-implemented method of claim 5, wherein modifying at least one of an encoder or a decoder comprises modifying one or more machine learning parameters associated with a first convolutional neural network (CNN) block to generate a second CNN block.

7. The computer-implemented method of claim 4, wherein a training phase is considered complete when the loss is less than or equal to a maximum acceptable loss.

8. The computer-implemented method of claim 1, wherein generating the tiled activation comprises concatenating the view activations along a single dimension.

9. The computer-implemented method of claim 1, further comprising, for each virtual camera included in a plurality of virtual cameras, rendering the first 3D geometry based on the virtual camera to generate a different view included in the plurality of views.

10. The computer-implemented method of claim 1, wherein at least two of the view activations are generated at least partially in parallel.

11. The computer-implemented method of claim 1, wherein each view included in the plurality of views comprises a different rendering.

12. The computer-implemented method of claim 1, further comprising generating a different plurality of views for each 3D geometry included in a training database.

13. One or more non-transitory computer-readable media including instructions that, when executed by one or more processors, cause the one or more processors to perform the steps of:
    for each view included in a plurality of views associated with a first 3D geometry, generating a view activation;
    generating a tiled activation based on the view activations;
    generating a shape embedding based on the tiled activation;
    generating a decoded tiled activation based on the shape embedding having a fixed size, wherein a plurality of other shape embeddings generated based on a plurality of other 3D geometries also have the fixed size;
    splitting the decoded tiled activation into a plurality of decoded view activations; and
    for each decoded view activation, generating at least one reconstructed view associated with the first 3D geometry.

14. The one or more non-transitory computer-readable media of claim 13, wherein the shape embedding includes a first vector having the fixed size that is based on the tiled activation.

15. The one or more non-transitory computer-readable media of claim 14, wherein the fixed size is selected to control an amount of compute resources used when comparing the shape embedding to another shape embedding generated for a second 3D geometry.

16. The one or more non-transitory computer-readable media of claim 13, further comprising computing a loss based on the plurality of views and the plurality of reconstructed views.

17. The one or more non-transitory computer-readable media of claim 16, further comprising modifying at least one of an encoder or a decoder based on the loss.

18. The one or more non-transitory computer-readable media of claim 17, wherein modifying at least one of an encoder or a decoder comprises modifying one or more machine learning parameters associated with a first convolutional neural network (CNN) block to generate a second CNN block.

19. The one or more non-transitory computer-readable media of claim 16, wherein a training phase is considered complete when the loss is less than or equal to a maximum acceptable loss.

20. The one or more non-transitory computer-readable media of claim 13, wherein generating the tiled activation comprises concatenating the view activations along a single dimension.

21. The one or more non-transitory computer-readable media of claim 13, further comprising, for each virtual camera included in a plurality of virtual cameras, rendering the first 3D geometry based on the virtual camera to generate a different view included in the plurality of views.

22. The one or more non-transitory computer-readable media of claim 13, wherein at least two of the view activations are generated at least partially in parallel.

23. The one or more non-transitory computer-readable media of claim 13, wherein each view included in the plurality of views comprises a different rendering.

24. The one or more non-transitory computer-readable media of claim 13, further comprising generating a different plurality of views for each 3D geometry included in a training database.

25. A system, comprising:
one or more memories including instructions; and
one or more processors that are coupled to the one or more memories and, when executing the instructions, are configured to perform the steps of:
   for each view included in a plurality of views associated with a first 3D geometry, performing one or more convolutions to generate a view activation;
   generating a tiled activation based on the view activations;
   performing one or more convolutions on the tiled activation to generate a shape embedding having a fixed size, wherein a plurality of other shape embeddings generated based on a plurality of other 3D geometries also have the fixed size;
   performing one or more transposed convolutions on the shape embedding to generated a decoded tiled activation;
   splitting the decoded tiled activation into a plurality of decoded view activations; and
   for each decoded view activation, performing one or more transposed convolutions to generate at least one reconstructed view associated with the first 3D geometry.

* * * * *